US008877367B2

(12) United States Patent
Holme et al.

(10) Patent No.: US 8,877,367 B2
(45) Date of Patent: Nov. 4, 2014

(54) HIGH ENERGY STORAGE CAPACITOR BY EMBEDDING TUNNELING NANO-STRUCTURES

(75) Inventors: Timothy P. Holme, San Francisco, CA (US); Friedrich B. Prinz, Woodside, CA (US); Philip B. Van Stockum, Redwood City, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 838 days.

(21) Appl. No.: 12/928,346

(22) Filed: Dec. 9, 2010

(65) Prior Publication Data

US 2012/0156545 A1 Jun. 21, 2012

Related U.S. Application Data

(63) Continuation-in-part of application No. 12/657,198, filed on Jan. 15, 2010, which is a continuation-in-part of application No. 12/798,102, filed on Mar. 29, 2010, now Pat. No. 8,524,398.

(60) Provisional application No. 61/205,459, filed on Jan. 16, 2009, provisional application No. 61/211,746, filed on Apr. 1, 2009, provisional application No. 61/211,745, filed on Apr. 1, 2009, provisional application No. 61/274,866, filed on Aug. 20, 2009, provisional application No. 61/283,891, filed on Dec. 9, 2009, provisional application No. 61/398,492, filed on Jun. 24, 2010, provisional application No. 61/399,574, filed on Jul. 13, 2010.

(51) Int. Cl.
| H01M 2/14 | (2006.01) |
| H01G 9/02 | (2006.01) |
| H01L 29/12 | (2006.01) |
| H01G 9/048 | (2006.01) |
| H01L 49/02 | (2006.01) |

(52) U.S. Cl.
CPC ............... *H01G 9/02* (2013.01); *H01L 29/127* (2013.01); *H01G 9/048* (2013.01); *Y02T 10/7022* (2013.01); *H01L 28/40* (2013.01)

USPC .......................................... 429/144; 429/246

(58) Field of Classification Search
USPC .................................... 429/144, 246
See application file for complete search history.

(56) References Cited

U.S. PATENT DOCUMENTS

| 4,882,649 A | 11/1989 | Chen et al. |
| 5,414,588 A | 5/1995 | Barbee, Jr. et al. |

(Continued)

FOREIGN PATENT DOCUMENTS

WO   WO 2010/023575   3/2010

OTHER PUBLICATIONS

Garcia Del Muro et al., "Metallic nanoparticles embedded in a dielectric matrix: growth mechanisms and percolation", 2008, Art. ID 475168, Journal of Nanomaterials.

(Continued)

*Primary Examiner* — Mark F Huff
*Assistant Examiner* — Monique Willis
(74) *Attorney, Agent, or Firm* — Lumen Patent Firm

(57) ABSTRACT

In an All-Electron Battery (AEB), inclusions embedded in an active region between two electrodes of a capacitor provide enhanced energy storage. Electrons can tunnel to/from and/or between the inclusions, thereby increasing the charge storage density relative to a conventional capacitor. One or more barrier layers is present in an AEB to block DC current flow through the device. The AEB effect can be enhanced by using multi-layer active regions having inclusion layers with the inclusions separated by spacer layers that don't have the inclusions. The use of cylindrical geometry or wrap around electrodes and/or barrier layers in a planar geometry can enhance the basic AEB effect. Other physical effects that can be employed in connection with the AEB effect are excited state energy storage, and formation of a Bose-Einstein condensate (BEC).

20 Claims, 16 Drawing Sheets

(56) References Cited

U.S. PATENT DOCUMENTS

| | | | |
|---|---|---|---|
| 5,684,309 A | 11/1997 | McIntosh et al. | |
| 6,137,192 A | 10/2000 | Staffiere | |
| 6,137,671 A | 10/2000 | Staffiere | |
| 6,477,035 B1 | 11/2002 | Cepas et al. | |
| 6,830,971 B2 | 12/2004 | Balakumar et al. | |
| 6,867,449 B2 | 3/2005 | Marsh et al. | |
| 7,057,881 B2 | 6/2006 | Chow et al. | |
| 7,208,802 B2 | 4/2007 | Shimizu et al. | |
| 7,265,406 B2 | 9/2007 | Kellar et al. | |
| 7,268,411 B2 | 9/2007 | Shimizu et al. | |
| 7,295,419 B2 | 11/2007 | Chow et al. | |
| 7,323,398 B2 | 1/2008 | Akatsu | |
| 7,365,395 B2 | 4/2008 | Stumbo et al. | |
| 7,428,137 B2 | 9/2008 | Dowgiallo, Jr. | |
| 7,466,536 B1 | 12/2008 | Weir et al. | |
| 7,575,978 B2 | 8/2009 | Kraus et al. | |
| 7,662,731 B2 * | 2/2010 | Itoh et al. | 438/795 |
| 7,687,876 B2 | 3/2010 | Kabir | |
| 7,750,869 B2 | 7/2010 | Mosallaei | |
| 7,763,511 B2 | 7/2010 | Majhi et al. | |
| 2006/0164788 A1 | 7/2006 | Eisenring | |
| 2007/0121274 A1 | 5/2007 | Talvacchio et al. | |
| 2008/0062614 A1 | 3/2008 | Goia | |
| 2008/0180883 A1 | 7/2008 | Palusinski et al. | |
| 2009/0047453 A1 | 2/2009 | Folaron et al. | |
| 2009/0090999 A1 | 4/2009 | Carver | |
| 2009/0096004 A1 | 4/2009 | Kawabata et al. | |
| 2009/0124483 A1 | 5/2009 | Lin et al. | |
| 2009/0195961 A1 | 8/2009 | Eisenring | |
| 2009/0317664 A1 | 12/2009 | Niessen et al. | |
| 2010/0090663 A1 | 4/2010 | Pappas et al. | |
| 2010/0226066 A1 | 9/2010 | Sweeney et al. | |
| 2011/0020717 A1 * | 1/2011 | Kaye et al. | 429/423 |
| 2011/0275005 A1 * | 11/2011 | Zhu et al. | 429/482 |

OTHER PUBLICATIONS

Merrill et al., "Effective medium theories for artificial materials composed of multiple sizes of spherical inclusions in a host continuum", 1999, pp. 142-148, IEEE Trans. Antennas and Propagation v47n1.

Dupree et al., "The electronic properties of small metal particles: The electric polarizability", 1972, pp. 408-414, J. Phys. C: Solid State Physics, v5.

* cited by examiner

US 8,877,367 B2

HIGH ENERGY STORAGE CAPACITOR BY EMBEDDING TUNNELING NANO-STRUCTURES

CROSS REFERENCE TO RELATED APPLICATIONS

This application is a continuation in part of U.S. application Ser. No. 12/657,198, filed on Jan. 15, 2010, entitled "Quantum Dot Ultracapacitor and Electron Battery", and hereby incorporated by reference in its entirety. Application Ser. No. 12/657,198 claims the benefit of U.S. provisional patent applications 61/205,459 filed on Jan. 16, 2009, and 61/211,746 filed on Apr. 1, 2009, which are hereby incorporated by reference in their entirety.

This application is also a continuation in part of U.S. application Ser. No. 12/798,102, filed on Mar. 29, 2010, now U.S. Pat. No. 8,524,398 entitled "All-electron battery having area-enhanced electrodes", and hereby incorporated by reference in its entirety. Application Ser. No. 12/798,102 claims the benefit of U.S. provisional patent applications 61/211,746 filed on Apr. 1, 2009, 61/211,745 filed on Apr. 1, 2009, and 61/274,866 filed on Aug. 20, 2009, which are hereby incorporated by reference in their entirety.

This application claims the benefit of U.S. provisional patent application 61/283,891, filed on Dec. 9, 2009, entitled "High energy storage capacitor by embedding metal nano-structures", and hereby incorporated by reference in its entirety.

This application also claims the benefit of U.S. provisional patent application 61/398,492, filed on Jun. 24, 2010, entitled "All Electron Battery Enhanced by Bose-Einstein Condensate Formation", and hereby incorporated by reference in its entirety.

This application also claims the benefit of U.S. provisional patent application 61/399,574, filed on Jul. 13, 2010, entitled "Energy storage device with large charge separation in structures containing pn junctions", and hereby incorporated by reference in its entirety.

GOVERNMENT SPONSORSHIP

This invention was made with Government support under contract number W911NF-07-2-0027 awarded by the US Army Research Laboratory, and under contract numbers DE-SC0001060 and DE-AR0000069 awarded by the Department of Energy. The Government has certain rights in this invention.

FIELD OF THE INVENTION

This invention relates to energy storage.

BACKGROUND

Energy storage is a crucial component of a large number and variety of electronic devices, particularly for mobile devices and electric or hybrid vehicles. Energy storage devices have been based on a wide variety of physical effects. For example, electric fields can be employed to store energy in capacitors, and chemical reactions (involving ion motion) can be employed to store energy in batteries. However, energy storage in a capacitor can be limited by the device geometry (e.g., 2-D capacitor plates having limited area), and batteries can have a slow response time due to the ion motion inherent in electrochemical reactions.

Battery powered devices such as hybrid or electric vehicles are often limited in performance by the low energy stored per weight in batteries. Batteries have low storage density due to the low voltage produced by electrochemical reactions and the large size and weight of the ions stored in the batteries. Slow ion transport in batteries also causes slow charge and discharge performance. Furthermore, the reliance of existing batteries on ionic transport causes high degradation rates of the batteries.

Accordingly, it would be an advance in the art to provide energy storage having higher energy density than a capacitor, faster charge/discharge than a battery and/or much longer lifetime than a battery.

SUMMARY

Improved energy storage is provided by exploiting several physical effects individually or in combination. The first effect can be referred to as the All-Electron Battery (AEB) effect, and relates to the use of inclusions embedded in an active region between two electrodes of a capacitor. Electrons can tunnel to/from and/or between the inclusions, thereby increasing the charge storage density relative to a conventional capacitor. One or more barrier layers is present in an AEB to block DC current flow through the device. The AEB effect can be enhanced by using multi-layer active regions having inclusion layers with the inclusions separated by spacer layers that don't have the inclusions. The use of cylindrical geometry or wrap around electrodes and/or barrier layers in a planar geometry can enhance the basic AEB effect.

Other physical effects that can be employed in connection with the AEB effect are excited state energy storage, and formation of a Bose-Einstein condensate (BEC). In excited state energy storage, the inclusions have excited states with higher energy than their ground states, and energy can be stored by transferring charge to the excited states. This effect can increase energy storage capacity. Although electrons cannot form a BEC because they are fermions, the bound electrons-hole pairs known as excitons that can form in semiconductors are bosons, and can therefore form a BEC. All-electron batteries can be configured to facilitate exciton formation and hence BEC formation. BEC formation is expected to increase resistance to field emission tunneling, increase dielectric constant, and reduce the ground state energy with the result that more energy can be stored in excited states before instability occurs.

Applications include grid energy storage, electric vehicle energy storage (EV or PHEV battery), portable electronics (laptop, cell phone, etc.), and troop gear/weapons, where the advantages include high energy density storage (possibly greater than 250 Whr/kg), high power density storage ($\sim 10^8$ W/kg), fast charge/discharge rate, and low degradation over time because there are no chemical reactions. Further advantages include no moving atoms/ions, and no risk of catastrophic, unsafe failure.

The present approach relates to a capacitor and an electron battery having very high storage density. Because the present approach relies on electrical energy stored as electrons instead of ions, small and light devices with high storage capacities are provided. Furthermore, electron transport allows for fast charge and discharge. The present solid-state devices can also have improved lifetime relative to existing energy storage devices. In this approach, energy storage is via electrons in bulk, as opposed to surface charges (e.g., conventional capacitors) or ions (e.g., batteries).

BRIEF DESCRIPTION OF THE DRAWINGS

FIG. 5b shows I-V data for the control structure of FIG. 5a.

FIGS. 6b-f show experimental data from the test structure of FIG. 6a.

DETAILED DESCRIPTION

FIGS. 1a-d show several embodiments of the invention. In general terms, embodiments of the invention are energy storage devices that include a first electrode, a second electrode, one or more active layers (or active regions), and one or more barrier layers. The active layer(s) and barrier layer(s) are sandwiched between the electrodes. The active layers have inclusions disposed in an active layer matrix such that electrons can flow to or from the inclusions by tunneling through the active layer matrix. The barrier layers substantially prevent electron tunneling across the barrier layers (and also substantially block all other DC current flow). Such devices are capable of storing energy by establishing a charge separation with the inclusions, and are capable of providing energy by using this charge separation as an energy source.

Figure 1A:
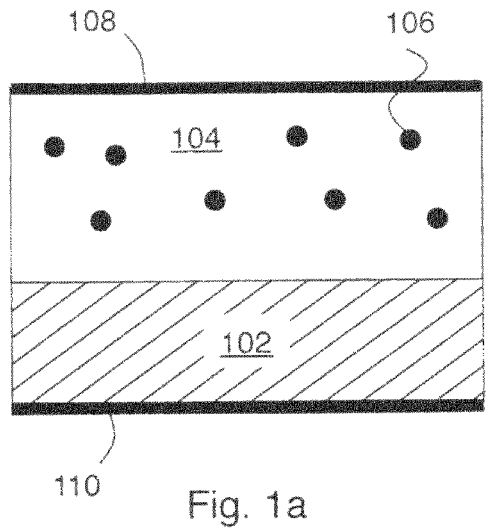
FIGS. 1a-d show several embodiments of the invention.
Figure 1B:
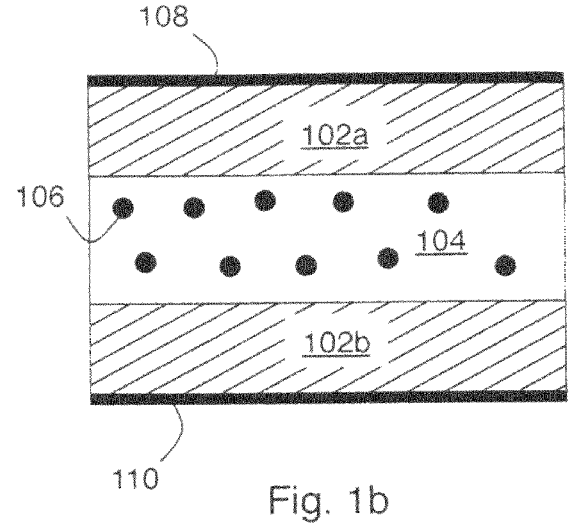
Figure 1C:
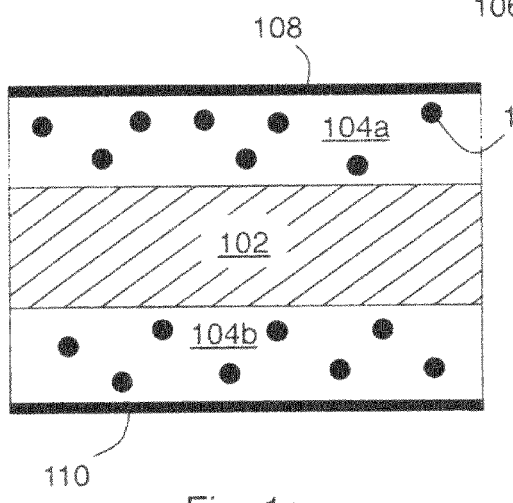

In the example of FIG. 1a, a barrier layer 102 and an active layer 104 are sandwiched between electrodes 108 and 110. One of the inclusions of active layer 104 is referenced as 106. FIG. 1b shows an example where two barrier layers 102a,b sandwich an active layer 104. FIG. 1c shows an example where two active layers 104a,b sandwich a barrier layer 102.

Figure 1D:
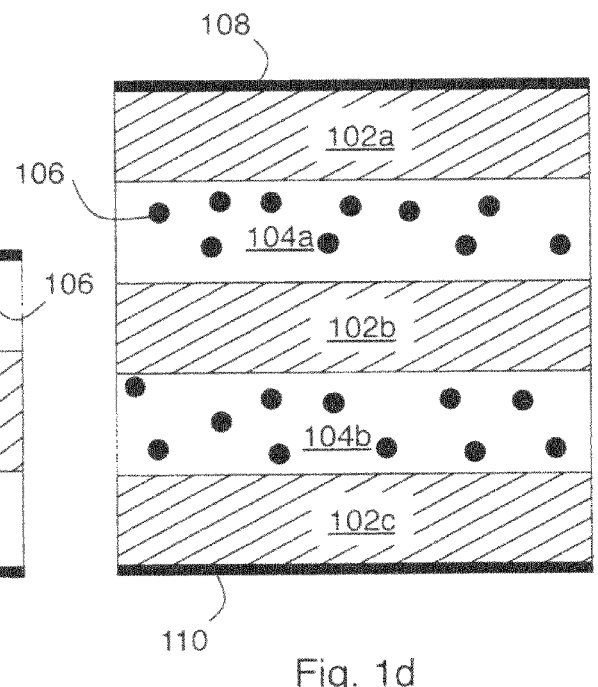

FIG. 1d shows an alternating arrangement of active layers 104a,b and barrier layers 102a,b,c.

It is convenient to refer to such devices as all-electron batteries (AEBs). One way to appreciate the AEB is to compare it to a conventional capacitor, as could be obtained from FIG. 1a by removing active layer 104 and expanding barrier layer 102 to fill the space between the electrodes. In the AEB of FIG. 1a, energy storage can be provided, in part, by establishing a charge separation with the inclusions. For example, a charge separation could result from net negative charge on the inclusions and net positive charge on the opposing electrode 110. Such energy storage is based on volume storage of charge (i.e., on the inclusions). In contrast, the charge separation of a conventional capacitor is exclusively determined by surface charges on the electrodes, and volume storage of charge is not possible. As active layers are added, the possibilities for volume charge separation for energy storage increase. For example, in the configuration of FIG. 1c, the inclusions on opposite sides of barrier layer 102 can have opposite net charges.

The AEB allows for another possibility of charge storage relative to a conventional dielectric capacitor. The energy storage in a capacitor is related to the permittivity of the dielectric, which depends upon the magnitude of dipoles created when a given electric field is applied across the dielectric. By polarizing charge between inclusions in an active layer, the AEB allows the creation of larger dipoles (more charge separated over longer distance), which allows for more energy storage. For example, in the configuration of FIG. 1a, the inclusions nearer electrode 108 may carry a charge relatively negative compared to the inclusions nearer barrier layer 102, or vice versa. Additionally, the two effects may be combined, so that, in the configuration of FIG. 1c, all inclusions in active layer 104a are charged negatively with respect to inclusions in active layer 104b, while inclusions in layer 104a nearer electrode 108 are charged negatively with respect to inclusions in layer 104a nearer barrier layer 102. All combinations and permutations of relative charge are understood to be possible, the above situation being exemplary.

A noteworthy feature of the present device is that it tends to be large compared to microelectronic switching devices, such as transistors. In some embodiments, device dimensions can be comparable to or larger than conventional batteries (e.g., on the order of 1 m). Such size follows from its purpose of storing energy. Preferably, the electrodes each have a geometrical area of 1 $\mu m^2$ or greater, and more preferably the electrode area is 1 $mm^2$ or greater. Another typical feature of embodiments of the invention is operation at relatively high voltages. Preferably, charge separation with the inclusions is established by application of a voltage of 5V or more between the electrodes. Another noteworthy feature of some embodiments of the invention is that AEBs are preferably two terminal devices, where the only external device terminals are the electrodes on either side of the dielectric structure.

Embodiments of the invention can provide high charge storage density. To quantify this point, it is convenient to define the volume averaged charge separation density as follows: In a charged device having N extra electrons near one of its terminals and N missing electrons (e.g. holes) near the other terminal, and a volume between the terminals of V, the volume averaged charge separation density is N/V. Preferably, the volume averaged charge separation density can be $10^{-4}$ $e^-/nm^3$ or greater when a charge separation is present between the inclusions (i.e., when the AEB is in an energy storing state).

Important design parameters for AEBs include some or all of the following parameters: the spacing between electrodes and inclusions, the spacing between inclusions, the size, shape, and number density of inclusions, the tunneling energy barrier between electrodes and inclusions, the tunneling energy barrier between inclusions, dielectric constants, and work functions. The charge and discharge rates and storage capacities of the devices can be selected by appropriate geometrical design and material choice. Charge and discharge rates depend on the gaps between inclusions and the bandgap and dielectric constant of the active layer matrix material, therefore the rates can be altered by changing the distances between inclusions, and/or the dielectric constant and bandgap of the matrix material. Charge and discharge rates further depend upon the electron affinity of the active layer matrix material and of the inclusions.

Tunneling is a characteristic feature of the all-electron battery. Electrons can tunnel between the inclusions in an active layer and an electrode. Electrons can also tunnel between inclusions in the same active layer. In specific devices, either or both of these tunneling mechanisms may be relevant. Electron flow from one active layer to another active layer, by tunneling or by any other mechanism, is negligible due to the barrier layers. Thus, the barrier layers are layers of insulating material sufficiently thick to substantially prevent tunneling.

In the example of FIG. 1a, electrons can tunnel between electrode 108 and the inclusions in active layer 104, but tunneling from these inclusions to electrode 110 is blocked by barrier layer 102. In the example of FIG. 1b, electrons cannot tunnel between the electrodes and the active layer inclusions because of barrier layers 102. However, a charge separation can still be established with the inclusions. For example, tunneling between the inclusions of active layer 104 can provide a charge separation on the inclusions. Such tunneling can be induced by a voltage applied to electrodes 108 and 110.

Electrodes are preferably flat (i.e., sufficiently flat for wafer bonding and/or crystal growth), stable (i.e., shouldn't form dendrites), and have adequate electrical conductivity (i.e., sheet resistance<1 kΩ/sq). Active layers should allow charge transport to/from the inclusions, and should provide high density of inclusions (preferably more than $10^{15}$ inclusions per $cm^3$) to achieve a high charge storage in the active layer. The inclusions are preferably chemically stable in their environment (i.e., the active layer matrix), preferably provide high charge storage density (preferably over $10^{-4}$ $e^-/nm^3$), and preferably provide reversible charging (i.e., can both charge and discharge multiple times). Barrier layers preferably have high breakdown strength (preferably over 0.5V/nm and more preferably over 1V/nm), high resistivity (preferably over $10^{12}$ Ω-cm and more preferably over $10^{16}$ Ω-cm), and low leakage current (preferably below 100 nA/$cm^2$ at the fully charged field and more preferably below 1 nA/$cm^2$ at the fully charged field).

In some cases, the active layer(s) of an AEB are multi-layer structures. In such cases, it is convenient to refer to the active layer(s) as active region(s), each active region including spacer layers and inclusion layers, typically arranged in an alternating manner. The inclusion layers include the inclusions, while the spacer layers substantially do not include the inclusions. Within an active region, electrons can tunnel from one inclusion layer to another inclusion layer by tunneling through a spacer layer. Thus, the spacer layers do not act as barriers to tunneling.

Figure 2A:
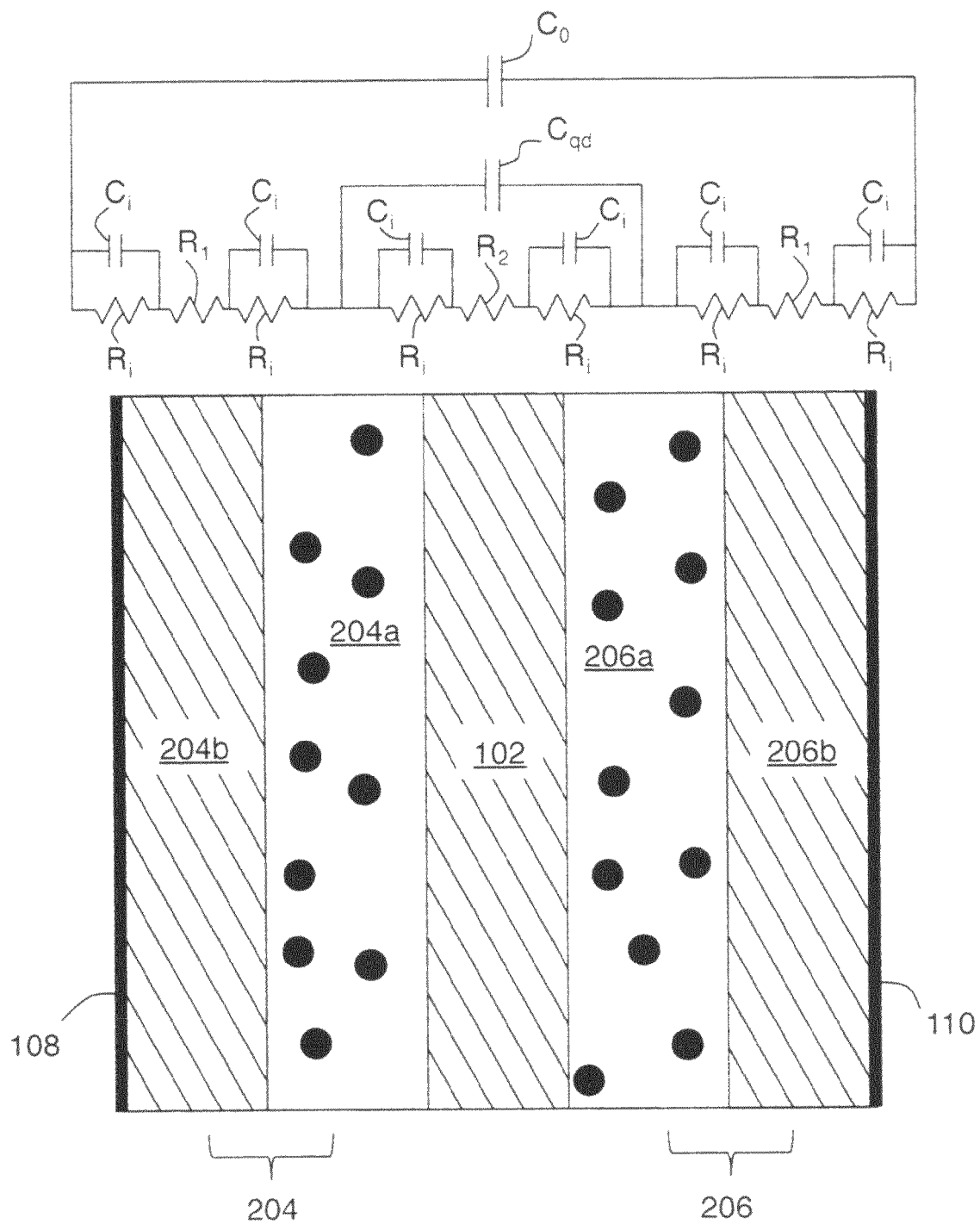
FIGS. 2a-c show embodiments of the invention having multi-layer active regions.
Figure 2B:
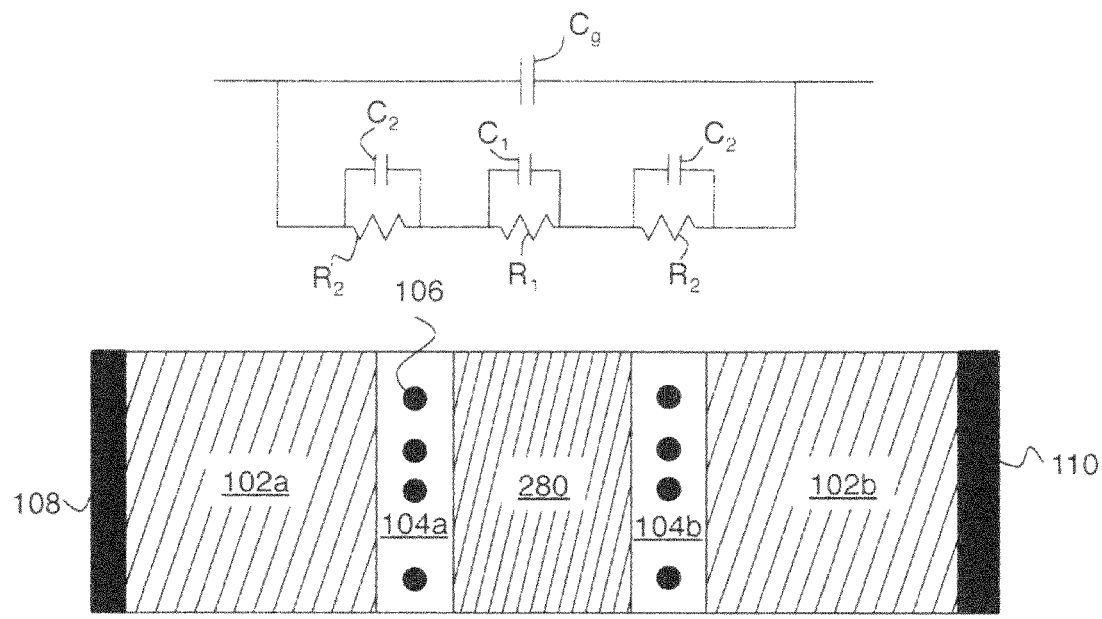
Figure 2C:
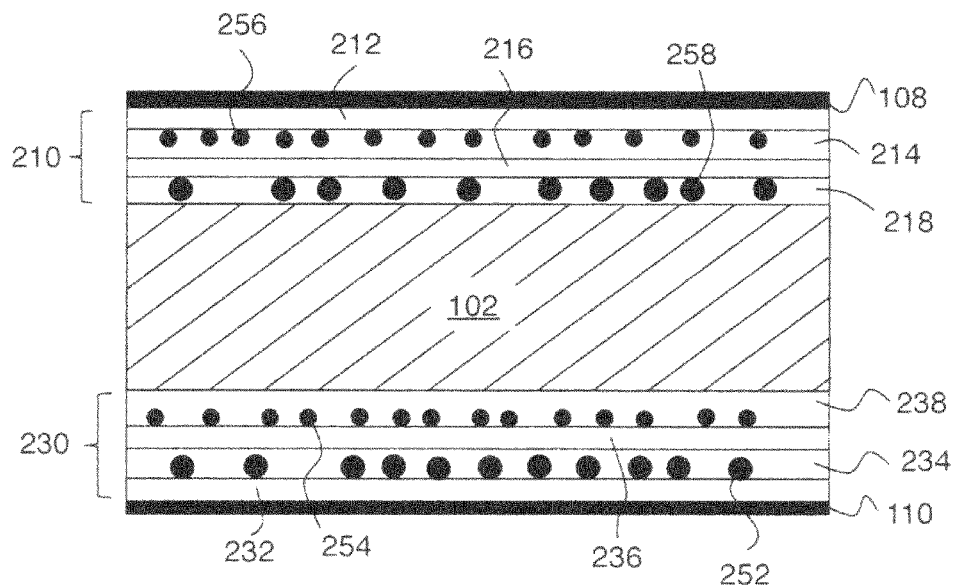

FIGS. 2a-c show embodiments of the invention having multi-layer active regions. In the example of FIG. 2a, a first active region 204 includes inclusion layer 204a and spacer layer 204b. A second active region 206 includes inclusion layer 206a and spacer layer 206b. Active regions 204 and 206 are separated by barrier layer 102. This assembly is sandwiched between electrodes 108 and 110. An equivalent circuit is shown above the layer diagram. On this equivalent circuit, $C_0$ is the capacitance of electrodes 108 and 110, $C_{qd}$ is the capacitance of inclusion layers 204a and 206a, and $C_i$ is an interface double-layer capacitance, which can be on the order of 1-50 μF/$cm^2$. As the number of active layers on each side of barrier layer 102 is increased, additional $C_{qd}$ and $C_i$ terms will contribute to the total capacitance, thereby increasing capacitance and energy storage. This equivalent circuit model provides another way to understand how AEBs can provide enhanced capacitance and energy storage.

A numerical example may aid understanding how addition of capacitors in series/parallel combinations increases the overall device capacitance. In reference to FIG. 2b, two barrier layers 102a,b adjacent to electrodes 108 and 110 sandwich two active layers 104a,b that contain inclusions, one of which is labeled 106. A spacer layer 280 is between the active layers 104a,b. Due to the effect described by the present invention, the effective permittivity between the active layers may be increased, for illustrative purposes we chose a value of 1000. If the intrinsic permittivity of the spacer and barrier layers is 3.9, the thickness of barrier layers is 5 nm, and the spacer layer is 2 nm, the overall capacitance of the device may be increased by 38%. The circuit diagram of FIG. 2b may help understanding the overall capacitance of the structure. The two capacitances labeled C2 are over the barrier layers 102a and 102b, and capacitance C1 is between the inclusion layers 104a and 104b.

In embodiments of this type, it is important for electrons to be able to tunnel through the spacer layers in order for charge transport to occur throughout the thickness of a multi-layer active region. The tunneling time has been investigated for various spacer layer parameters using simulation of the time-dependent Schrödinger equation. Simulated tunneling times are on the order of 4 fs or less for spacer layer parameters of height=6.8 eV, thickness=11.4 Å. Spacers having lower height and/or less thickness will have shorter tunneling times. Thus, it is expected that tunneling through the spacer layers will proceed with sufficient efficiency and speed.

FIG. 2c shows a detail view of an embodiment of the invention. In this example, the active regions are also organized as alternating inclusion and spacer layers. More specifically, active region 210 includes inclusion layers 214 and 218 separated by spacer layer 216. Inclusion layer 214 is separated from electrode 108 by spacer layer 212. Similarly, active region 230 includes inclusion layers 234 and 238 separated by spacer layer 236. Inclusion layer 234 is separated from electrode 110 by spacer layer 232. Active regions 210 and 230 are separated by a barrier layer 102. Inclusion layers can be metallic or be semiconductors and can contain embedded inclusions having an electron affinity that is higher than the electron affinity of the dielectric structure.

The inclusions can be arranged to provide a work function gradient for the inclusions, e.g., by providing an inclusion size and/or material composition gradient. The inclusion layers can include different materials having different work functions, and can be disposed to form a Fermi level gradient. The inclusion layers can include one or more materials having an electron affinity that is lower than an electron affinity of part or all of the spacer layers. The Fermi level gradient is arranged so that electrons (holes) flow from materials of higher (lower) work function to materials of lower (higher) work function during charging so that, during discharge, electron (hole) transport is aided by the Fermi level gradient. This ensures that for a charging voltage V>0 and current I>0, the discharge voltage will be in the quadrant V>0 and I<0.

This example includes, as a preferred feature, vertical stacking of inclusions. Each of the inclusion layers is capable of storing an amount of charge by itself, therefore the device with multiple inclusion layers is capable of storing a larger amount of charge. Since the voltage of these inclusion layers stacked in series is additive, and the energy density scales with the square of the voltage, a substantially higher energy density can be achieved.

In one embodiment, an energy storage device has inclusions of varying sizes. Preferably, large inclusions are placed near one electrode and smaller inclusions are placed near an opposing electrode. Charge is preferentially stored in the larger inclusions. The gradient in the size distribution allows polarization of the inclusions, even when the cell is neutral (e.g., a larger inclusion can be polarized due to its proximity to a smaller inclusion). When the device is charged, the excess charge is preferentially contained in the larger inclusion, thereby increasing the stored charge. It is noted that the inclusions can have a wide range of sizes. In particular, the larger inclusions can be nanowires, quantum wells, and/or bulk inclusions, while the smaller inclusions can be as small as an individual atom.

In another embodiment, the inclusions are made of different materials. Additionally, a first inclusion can be made from a material with a greater work function than a second inclusion. Electron transfer results from the Fermi level difference between materials in proximity, so a greater polarization can be achieved with a greater difference in Fermi level.

These principles can be better appreciated in view of the following more detailed example relating to FIG. 2c. In this specific example, a size gradient is employed. Inclusions in inclusion layer 234, one of which is referenced as 252, are larger than inclusions in inclusion layer 238 (one of which is referenced as 254). Similarly, inclusions in inclusion layer 218, one of which is referenced as 258, are larger than inclusions in inclusion layer 214 (one of which is referenced as 256). These size gradients provide a continuous change in work function across active regions 210 and 230 because work function decreases as size decreases for quantum-confined inclusions.

In this example, the thickness of inclusion layers 234, 238, 214 and 218 is preferably in a range from 0.3 nm to 300 µm. Barrier layer 102 preferably has a thickness in a range of 1 nm to 500 µm and preferably has a relatively high electron affinity, relatively high bandgap and relatively high breakdown voltage. The bandgap of barrier layer 102 may be above 1 eV and is preferably above 4 eV. The breakdown field for barrier layer 102 is preferably above 1 MV/cm and more preferably above 3 MV/cm. Barrier layer 102 can be made from materials including but not limited to: ZnS, $TiO_2$, $Al_2O_3$, $ZrO_2$, $Y_2O_3$, $HfO_2$, $Si_3N_4$, $SiO_2$, other oxides, nitrides, sulfides, and selenides, and mixtures or combinations thereof.

Some examples of materials useful for spacer layers 212, 216, 323, and 236 include, but are not limited to: $Al_2O_3$, Si, $TiO_2$, Ti-nitride, Ti-oxynitride, Ge, PbS, PbSe, PbO, InAs, InSb, ZnS, ZnO, $ZrO_2$, $HfO_2$, $SiO_2$, $Si_3N_4$, $Y_2O_3$, $BaTiO_3$, SrO, $SrTiO_3$, and mixtures or combinations thereof. Spacer layer thicknesses are preferably on the order of 0.3-5 nm in order to permit electron tunneling.

Electrode 108 preferably has a relatively small work function $\phi_s$ (i.e., $\phi_s$ below 4 eV and more preferably below 3 eV). Some exemplary materials useful for electrode 108 include but are not limited to: Zn, Li, Na, Mg, K, Ca, Rb, Sr, Ba, Cs, doped diamond and Y. Electrode 110 preferably has a relatively large work function $\phi_l$ (i.e., $\phi_l$ above 4.5 eV and more preferably above 5.5 eV). Some exemplary materials useful for electrode 110 include but are not limited to: Au, Pt, W, Al, Cu, Ag, Ti, Se, Ge, Pd, Ni, Co, Rh, Ir and Os. The electrode work function difference should reflect the overall gradient in work function in the inclusions.

Inclusion size gradients are highly polarizable using high density of state (DOS) materials including but not limited to: Ni, Pt, Cu, Ag, Au and Ir as inclusion materials. Inclusions are preferably chemically stable in the active region material (e.g. doesn't oxidize if the matrix material is an oxide). Materials useful for the inclusions include metals such as Pt, Au, Ni, Ag, W, Ti, Al, Cu, Pd, Cs, Li, Na, K, Y, Sr and Ba. Further examples of materials useful for the inclusions include low bandgap semiconductors such as InAs, InSb, PbSe, PbS, ZnS, CdSe, CdS, ZnSe, Ge, Si, Sn and conductive oxides such as $RuO_2$.

Another mechanism by which one can increase energy capacity in an electron storage device is increasing the dielectric constant of the dielectric material, thereby increasing the amount of charge that can be stored in the device at a given voltage. This can be accomplished by moving charges in the material over a larger distance, or by moving a larger number of charges. The Clausius-Mossotti (CM) theory of macroscopic dielectric response is helpful in this context. In this model, the macroscopic dielectric constant $\in$ is expressed in terms of parameters of microscopic inclusions. More specifically, the relevant microscopic parameters are N, the number density of inclusions, and $\alpha$, the polarizability of the inclusions. The CM result for $\in$ is given by:

$$\varepsilon = 1 + \frac{N\alpha/\varepsilon_0}{1 - N\alpha/3\varepsilon_0}$$

where $\in_0$ is the permittivity of free space. This model predicts large dielectric constant (i.e., large charge and energy storage) when $N\alpha$ is on the order of $3\in_0$.

Figure 3:
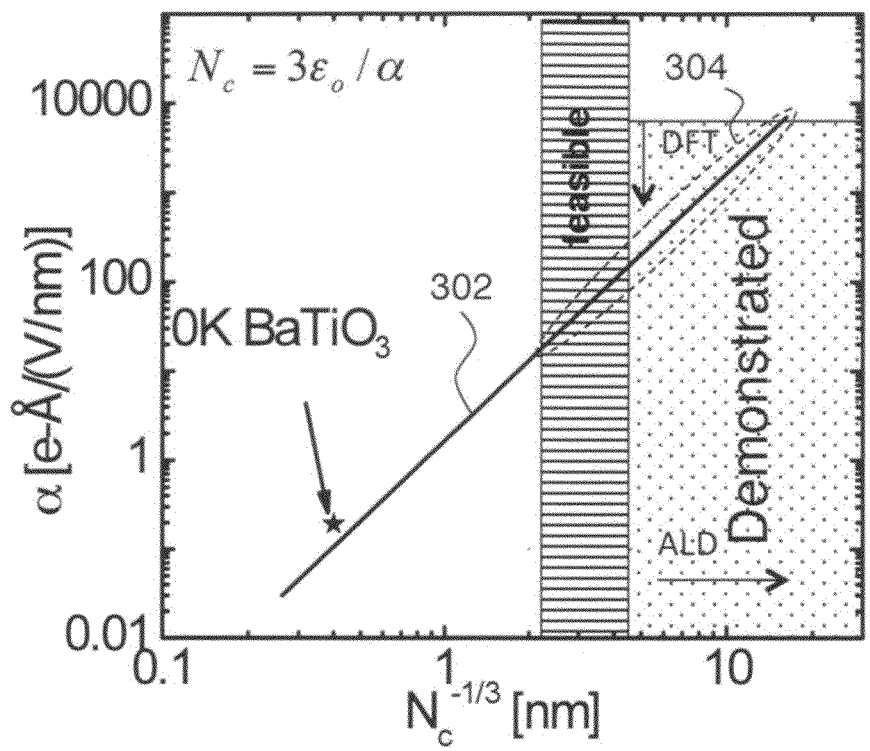
FIG. 3 shows parameter ranges relevant for embodiments of the invention.

FIG. 3 shows the N-$\alpha$ parameter space. Line 302 shows the locus of N-$\alpha$ points at which high $\in$ is predicted by the CM model. The star shows the 0K values of N and $\alpha$ for the material $BaTiO_3$, which is well known to have unusual dielectric properties. In particular, the dielectric constant of $BaTiO_3$ is highly temperature dependent, and can exceed 10,000 at 127° C. This behavior of $BaTiO_3$ provides evidence for the CM model, and suggests that other locations at or near line 302 may also provide useful dielectric properties. The dotted region on FIG. 3 shows the parameter space for nano-inclusions that can be reached with present-day growth techniques such as atomic layer deposition (ALD). Sputtering and other methods may be used to fabricate inclusions of the desired size. The region on FIG. 3 shown with horizontal lines show the parameter space for nano-inclusions that may be reachable with known growth techniques or minor modification thereof. According to the CM model, high dielectric constant for nano-inclusions can be reached in both the dotted and horizontal line regions of FIG. 3, and this part (i.e., region 304) of the N-$\alpha$ parameter space is thus of particular interest for AEB design. Larger inclusion sizes (lying further to the right on FIG. 3) may also be of interest to the AEB if stronger dipole moments are achievable. Larger inclusions may be fabricated by colloidal methods (in situ or ex situ and deposited by spin casting, Langmuir-Blodgett deposition, or otherwise), lithographic methods, stamping, or other methods known to those skilled in the art.

Figure 4:
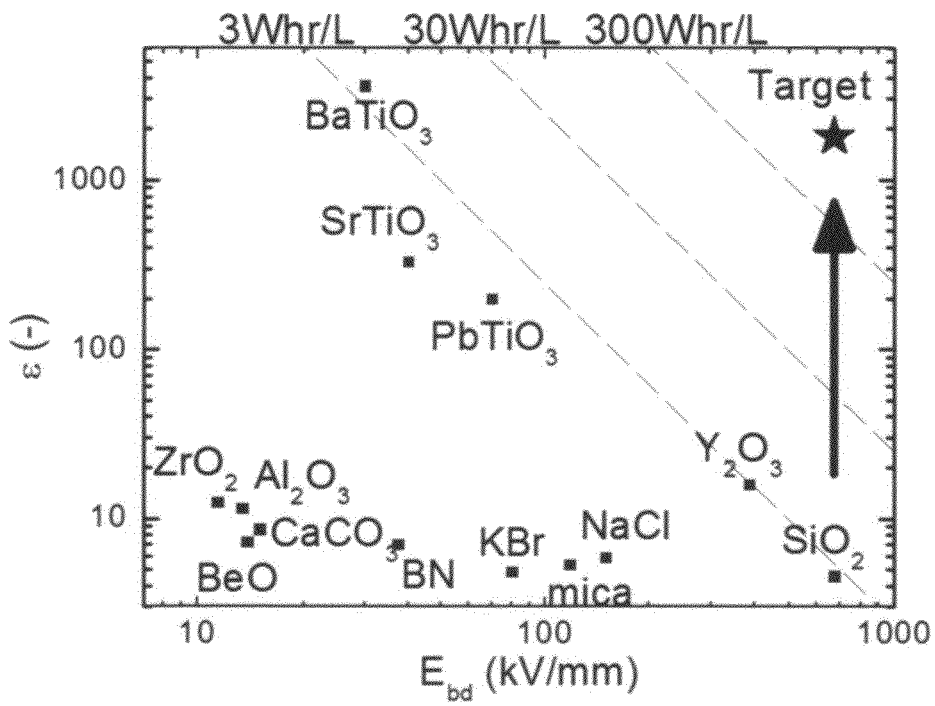
FIG. 4 shows dielectric constant and breakdown voltage for several materials.

Another way to appreciate the AEB is to consider the parameter space of dielectric constant and breakdown voltage. FIG. 4 shows dielectric constant and breakdown voltage for several materials. Materials with high dielectric constant have low breakdown voltage and vice versa. The AEB can be regarded as an approach for providing high dielectric constant that uses nano-structuring of high breakdown voltage materials in order to provide a high dielectric constant structure that also has high breakdown voltage. This approach appears to be much more promising than starting with high-∈ materials and trying to increase the breakdown voltage by nano-structuring. Guiding principles for AEBs include decoupling breakdown strength from permittivity, moving electrons rather than ions, and storing energy in electron-hole redox couples.

Figure 5A:
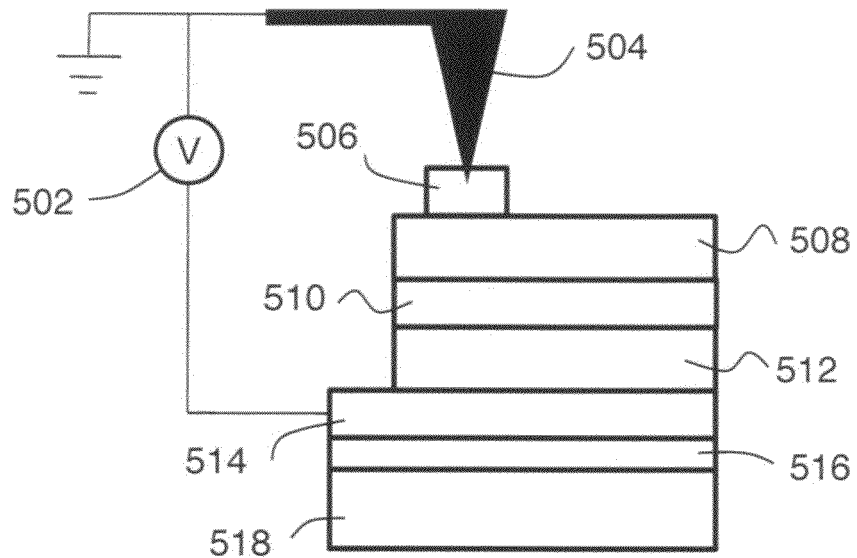
FIG. 5a shows a control structure for experiments relating to principles of the invention.

FIG. 5a shows a control structure for experiments relating to principles of the invention. In this example, a voltage source 502 provides input to a control sample via a Pt/Ir Atomic Force Microscope (AFM) tip 504. The control sample includes a quartz substrate 518, a Cr layer 516 and a Pt layer 514 which together form the bottom electrode of this sample, a 10 nm thick $ZrO_2$ insulating layer 512, a 10 nm thick conductive Pt layer 510, a 10 nm thick $ZrO_2$ insulating layer 508, and a Pt top electrode 506. This control structure is basically two capacitors in series.

Figure 5B:
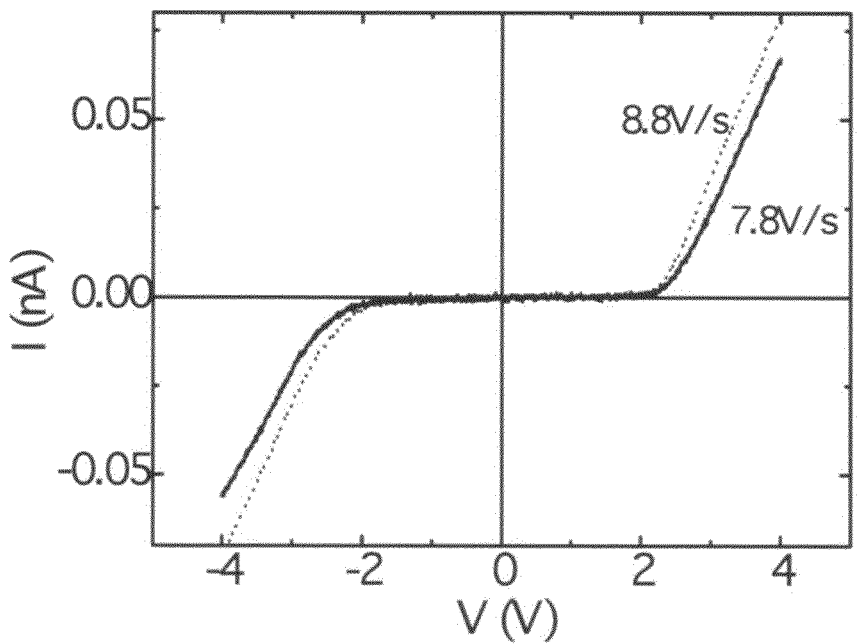

FIG. 5b shows I-V data for the control structure of FIG. 5a. The solid line shows results for a voltage sweep rate (dV/dt) of 7.8 V/s, and the dotted line shows results for a voltage sweep rate of 8.8 V/s. As expected, more current flows at the higher sweep rate, because capacitor current I is given by I=CdV/dt, where C is the capacitance.

Figure 6A:
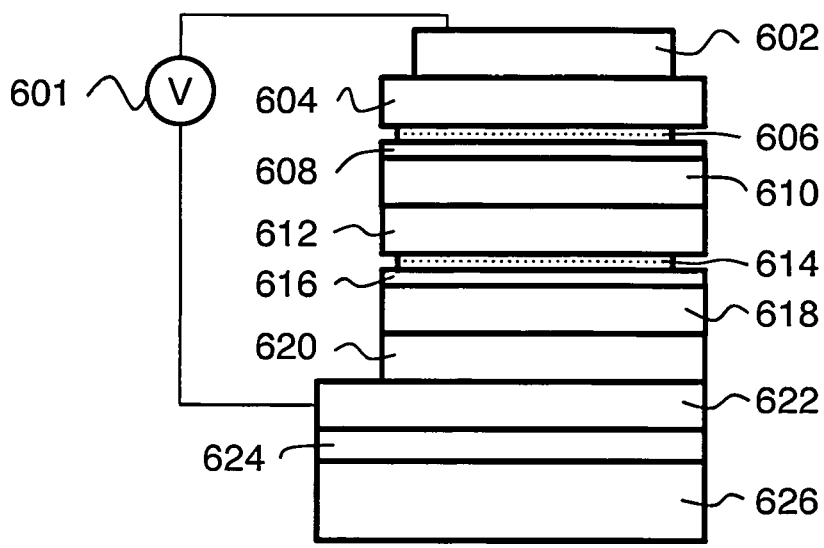
FIG. 6a shows a test structure relating to principles of the invention.

FIG. 6a shows a test structure relating to principles of the invention. In this example, a voltage source 601 provides input to a test sample via a Pt/Ir AFM tip (not shown). The test sample includes a quartz substrate 626, a Cr layer 624 and a Pt layer 622 which together form the bottom electrode of this sample, a 10 nm thick $ZrO_2$ insulating layer 620, a 10 nm thick conductive Pt layer 618, a 2 nm thick $ZrO_2$ insulating layer 616, a 10× Pt quantum dot layer 614, a 10 nm thick $ZrO_2$ insulating layer 612, a 10 nm thick conductive Pt layer 610, a 2 nm thick $ZrO_2$ insulating layer 608, a 10× Pt quantum dot layer 606, a 10 nm thick $ZrO_2$ insulating layer 604, and a Pt top electrode 602. Here, "10×" indicates that 10 ALD cycles of Pt were performed to form Pt islands having an average diameter of 1.7 nm and a number density of $3.2 \times 10^{12}$ dots/$cm^2$.

Figure 6B:
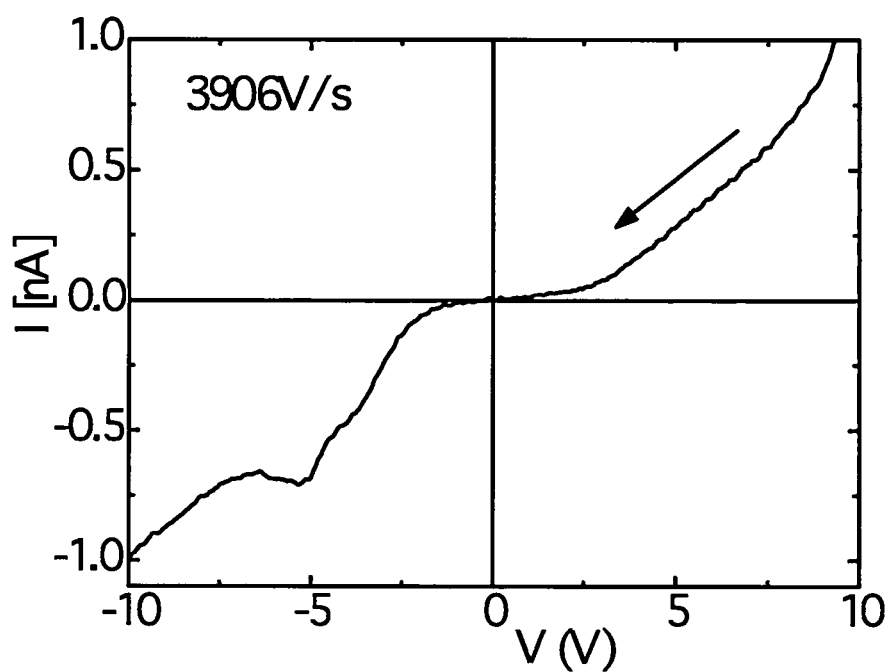
Figure 6C:
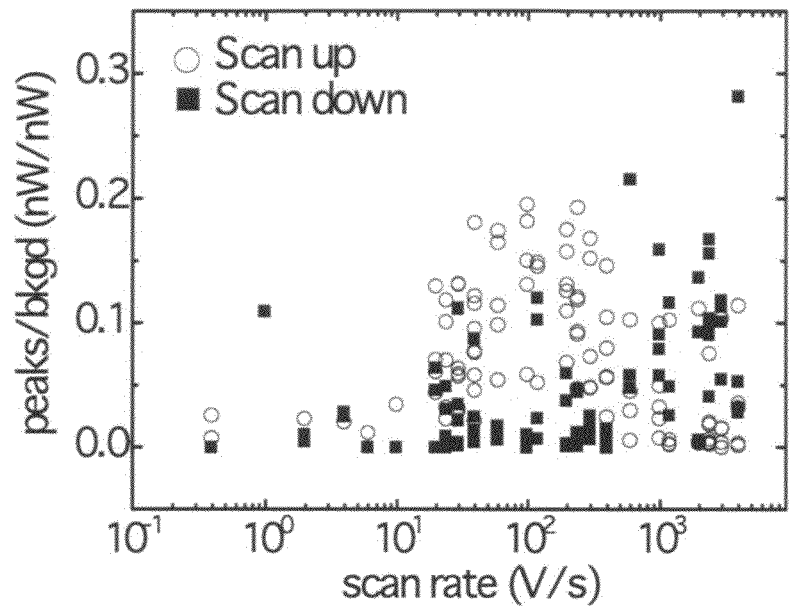
Figure 6D:
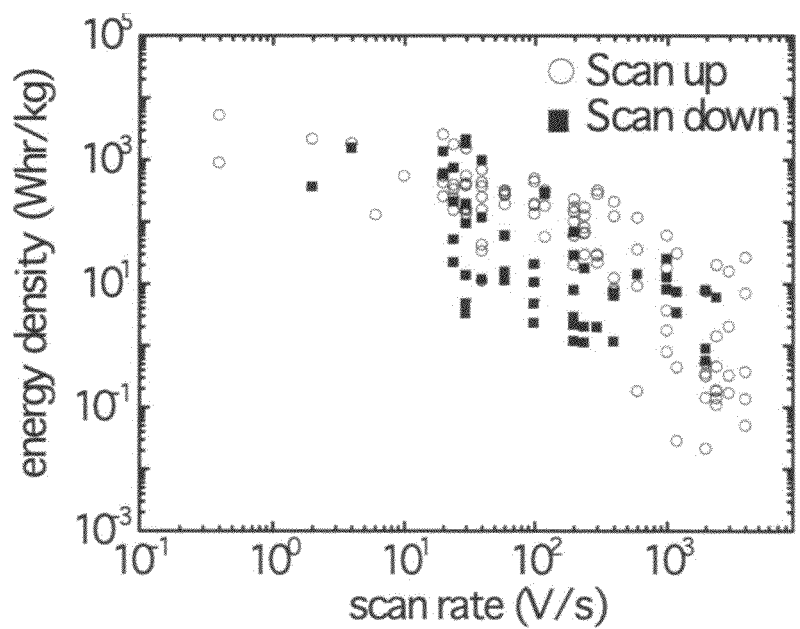

The experimental signature of the AEB effect is a peak in the I-V curve obtained during a sweep of applied voltage. FIG. 6b shows a representative example. In this example, a substantial I-V peak is seen as the voltage is swept from 10 V to −10 V at a sweep rate of 3906 V/s. This peak is attributed to the release of charge that was stored in the device as a result of bringing it to the initial condition of 10 V bias. Quantitative analysis of such I-V peaks provides the basis for experimental estimates of power and energy storage density. More specifically, FIG. 6c shows raw peak data for the structure of FIG. 6a, and FIG. 6d shows corresponding energy density results.

Figure 6E:
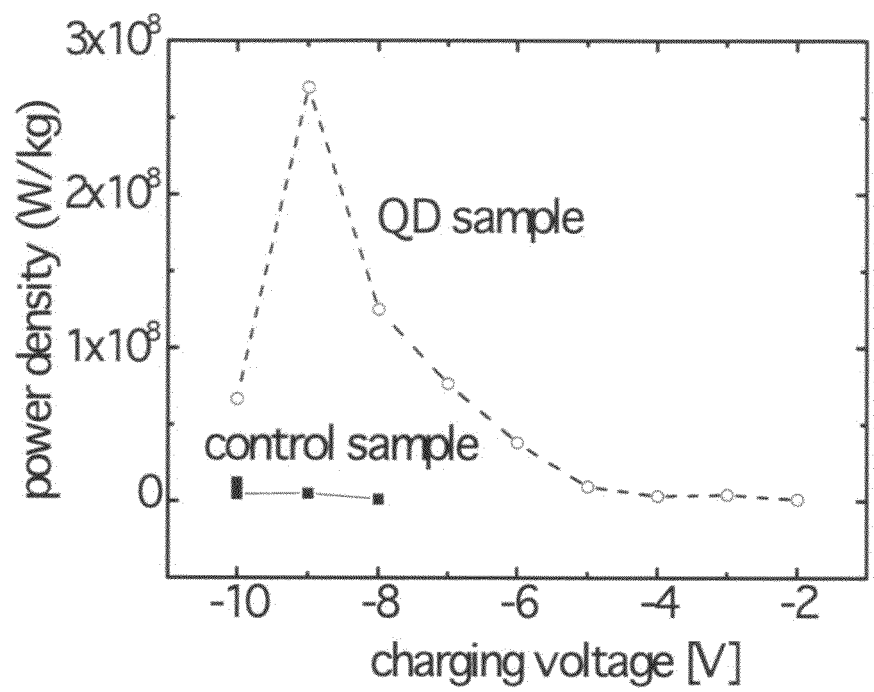
Figure 6F:
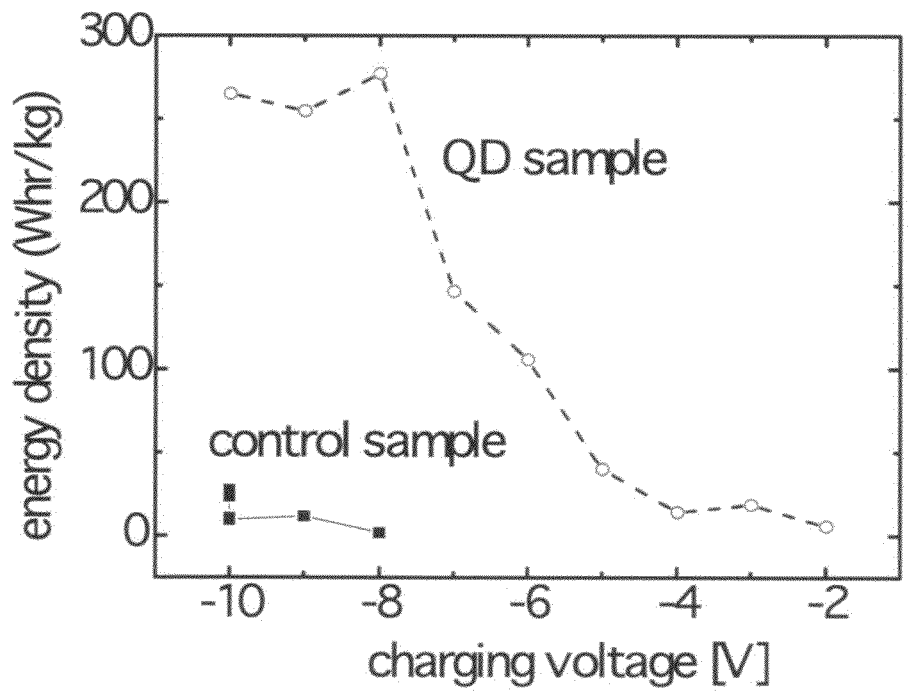

FIGS. 6e and 6f show comparative energy and power density results for the control structure of FIG. 5a and the test structure of FIG. 6a. The "charging voltage" on these plots is defined as follows. Voltage sweeps were performed from X volts to 10 volts, where X is the charging voltage and is negative. The voltage range from X to 0 volts acts to charge the device, while the voltage range from 0 to 10 V is the discharge range. Stored energy/power is seen to increase on these plots as the charging voltage is made more negative (i.e., the device is more completely charged).

Figure 7:
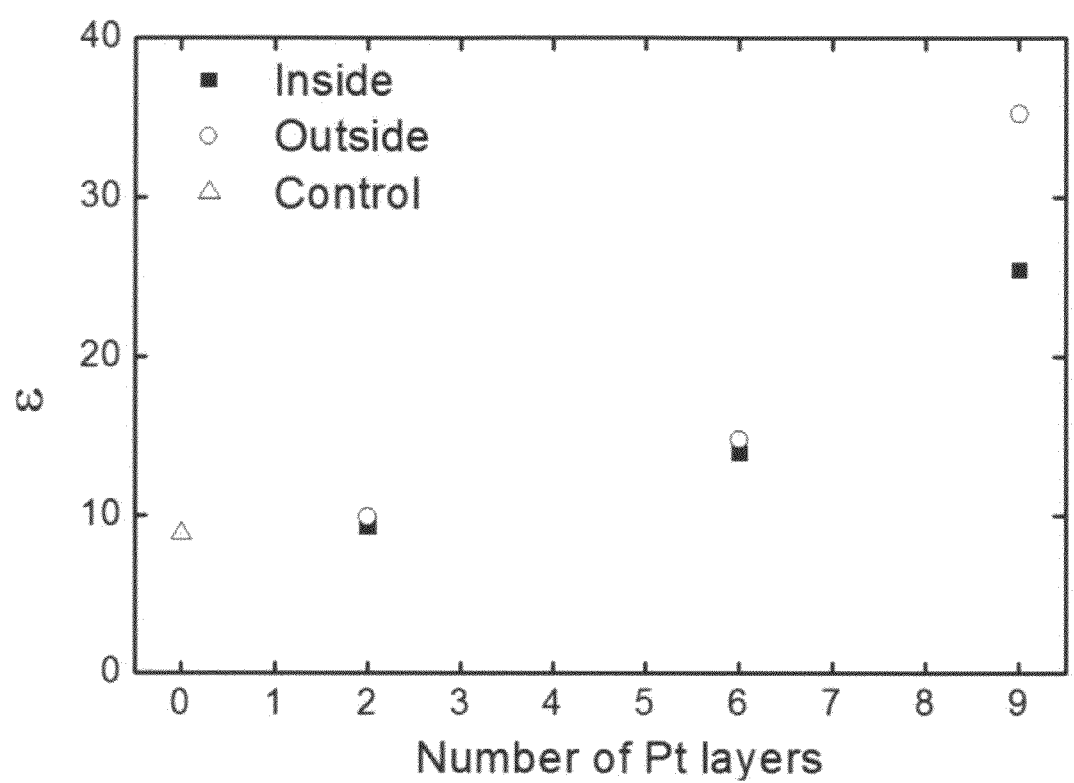
FIG. 7 shows experimental results from samples having relatively large electrode area.

FIG. 7 shows experimental results from samples having relatively large electrode area. In these experiments, two configurations were compared. The inside configuration is as shown on FIG. 1b, and the outside configuration is as shown on FIG. 1c. For both configurations, the active region(s) were repetitions of a unit cell having a Pt quantum dot layer with 15 ALD cycles of Pt as the well layer and a 2 nm $Al_2O_3$ spacer layer. This unit cell was repeated N times near each electrode in the outside configuration shown in FIG. 1c, and was repeated 2N times in the center of the structure in the inside configuration shown in FIG. 1b. For the outside configuration, the barrier layer was 22+4*(9−N) nm thick $Al_2O_3$. For the inside configuration, the two barrier layers were (22+4*(9−N))/2 nm thick near each electrode. The top electrode was a disk having a diameter of 3 mm. FIG. 7 shows results for N=2, 6, and 9. Substantially enhanced dielectric constants are obtained, especially for the "outside" configuration. An important feature of these results is that large dielectric constant is experimentally observed for a device having a macroscopic electrode area, as opposed to the top electrode basically being a microscopic probe tip.

In other experimental work on these devices, preliminary investigations of AEB lifetime have been performed. In one experiment, no decrease of AEB capacitance was seen over 400 charge-discharge cycles. In that experiment, a self-healing property of the dielectric was demonstrated, where the shunt resistance of the device increased over time. This self-healing effect may be due to larger local currents flowing through small areas of low resistance and burning out that area, effectively removing the defects from the cell. This self-healing property is important to prolong the life of the device.

Figure 8A:
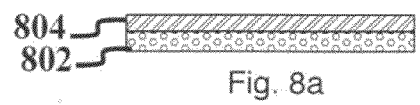
FIGS. 8a-j show an exemplary fabrication sequence for an embodiment of the invention.

FIGS. 8a-8j show a possible sequence of steps 800 for fabricating a solid-state energy device. As will be apparent to ones familiar with the art, many variations of steps and methods are possible, where the following exemplary sequence is provided. As shown in FIG. 8a, a substrate 802, such as glass, is cleaned and a back electrode 804 is deposited on it using sputter coating, evaporation or spin coating. Alternatively, a metal foil may be used as a substrate. Any metal deposition method can be employed for the electrodes, including but not limited to: vapor phase deposition and electroless plating.

Figure 8B:
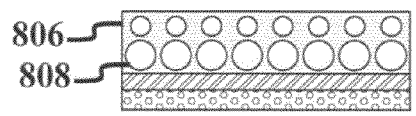
Figure 8C:
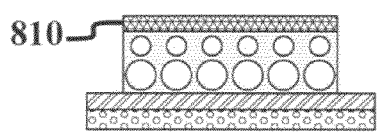
Figure 8D:
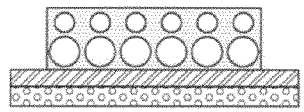

The assembly is cleaned and a 10 nm to 200 nm active region 806 having quantum dot inclusions 808 is deposited, preferably using atomic layer deposition (ALD), as shown in FIG. 8b. Any other quantum dot deposition technique can also be employed, including but not limited to vapor deposition, self-assembly, and processing of colloidal quantum dots. FIG. 8c shows the next step of providing a mask layer 810 on the active region 806 and etching the active region 806 in a desired shape or pattern. FIG. 8d shows removal of mask layer 810 removed followed by cleaning.

Figure 8E:
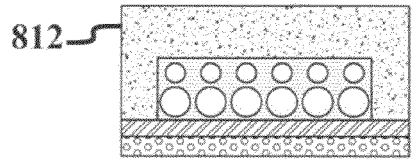

FIG. 8e shows the step of using chemical vapor deposition (CVD) or plasma vapor deposition (PVD) to deposit a 100 nm to 500 nm barrier layer 812 that is cleaned and optionally planarized. Any insulator deposition method can be employed.

Figure 8F:
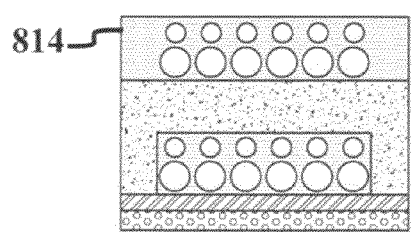
Figure 8G:
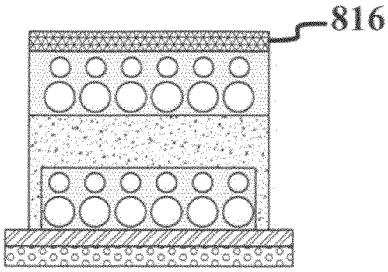
Figure 8H:
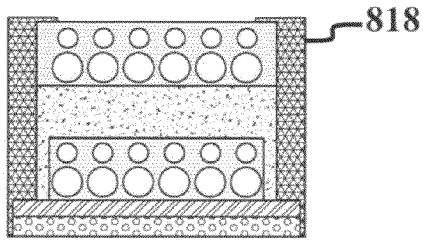
Figure 8I:
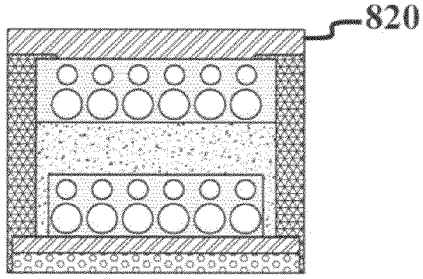
Figure 8J:
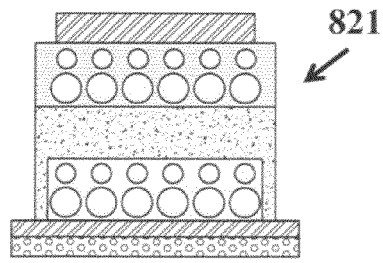

FIG. 8f shows the step of using ALD to deposit another 10 nm to 200 nm active region 814 on the insulating layer 812. The structure is provided with another masking layer 816 and etched, as shown on FIG. 8g. After removal of mask layer 816 followed by cleaning, FIG. 8h shows a metal lift-off mask layer 818 deposited from the base to the top of the structure. A top electrode 820 is deposited using sputtering, evaporation or spin coating, as shown in FIG. 8i. FIG. 8j shows the metal lift off layer 818 as being removed, and the final structure 821 can be cleaned for dicing, wire-bonding and packaging.

The preceding fabrication example describes a thin film deposition approach for fabricating an AEB. It is also possible to fabricate an AEB by the use of bulk growth and bonding, layer transfer, or a hybrid of any of these three approaches.

As an example of a bulk growth and bonding process, it is assumed that bulk samples of active region and barrier layer are available. One side of the barrier layer can be thinned, followed by bonding of the active region material to the barrier layer. Once the barrier layer and active region are bonded together, the barrier layer can be further thinned if/as needed and then bonded to metal to provide a first electrode. The second electrode can be provided by bonding metal to the exposed face of the active region opposite the first electrode.

Layer transfer approaches are based on the use of ion implantation to form a region of weakness at a selectable depth in a structure, followed by separating the structure at its point of weakness. It is convenient to summarize this process as cutting at a particular location. Further details on this approach can be found in U.S. Pat. No. 7,323,398, hereby incorporated by reference in its entirety. One approach for using layer separation in AEB fabrication is to start with a substrate having a thin insulator layer over a metal, bond active region structure to the exposed face of the insulator layer, and then use layer transfer to cut the active region such that the desired thickness of active region remains on the insulating layer. Another approach for using layer separation in AEB fabrication is to bond active region and barrier layer material, followed by using layer transfer to cut the barrier layer material such that the desired thickness of barrier layer material remains on the active region.

Figure 9A:
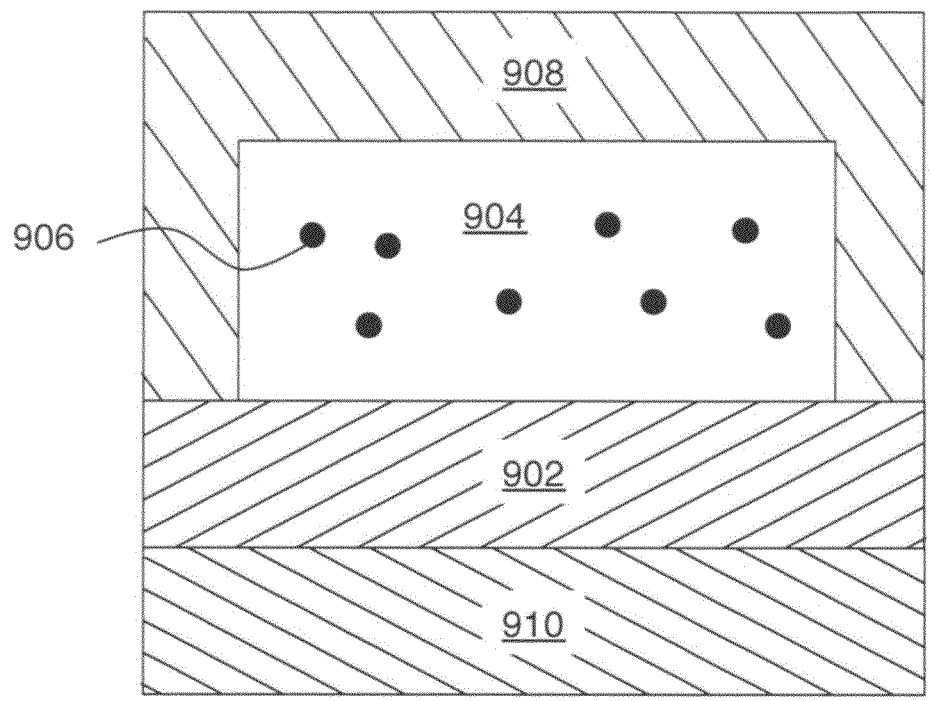
FIGS. 9a-b show embodiments of the invention having a wrap-around geometry.
Figure 9B:
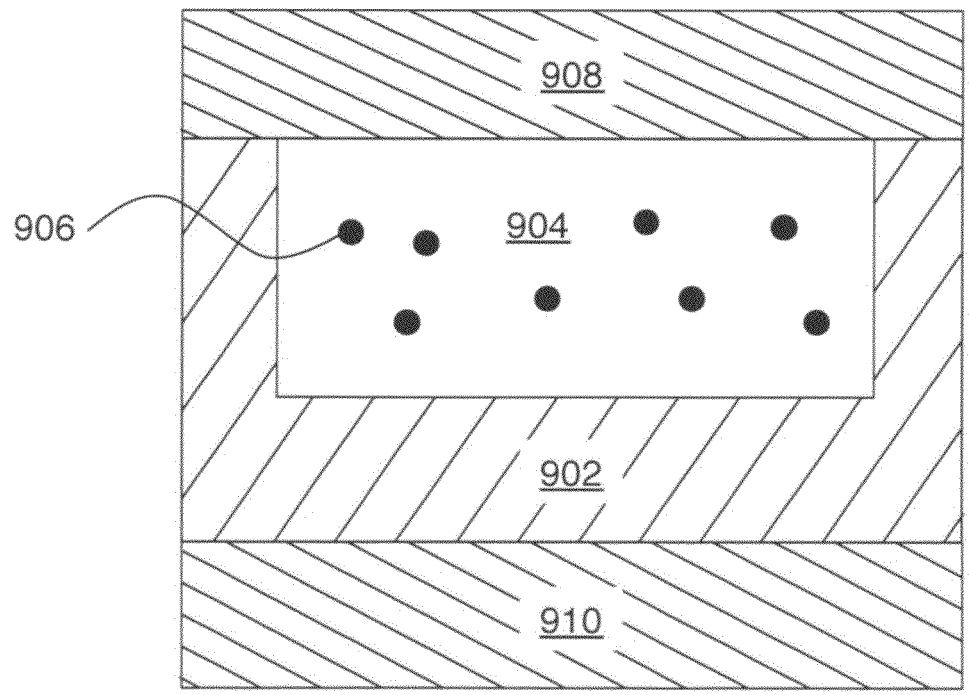

FIGS. 9a-b show embodiments of the invention having a wrap-around geometry. In the example of FIG. 9a, an active region 904 is next to a barrier layer 902 and has inclusions, one of which is referenced as 906. Electrode 910 is disposed adjacent to barrier layer 902. Electrode 908 wraps around active region 904 and also makes contact with barrier layer 902. The example of FIG. 9b is similar to the example of FIG. 9a, except that barrier layer 902 wraps around active region 904. In either case, such a wrap-around geometry can help to prevent charge leakage, and can cause concentration of electric field lines in the active region, both of which are desirable. In an AEB with a mesa structure with an electrode of smaller lateral dimension than the active and barrier layers, as shown in FIG. 8j, there may be leakage currents flowing between the two electrodes on the surfaces of the barrier and active layers. Surface conduction may be possible when organic contamination, water vapor, or other species sit on the surface. The wrap-around structures shown in FIG. 9a and FIG. 9b can reduce this surface leakage current. A concentration of the electric field is desirable because voltage that is dropped over the active layers contributes to polarization via the AEB effect, increasing energy storage.

Figure 10A:
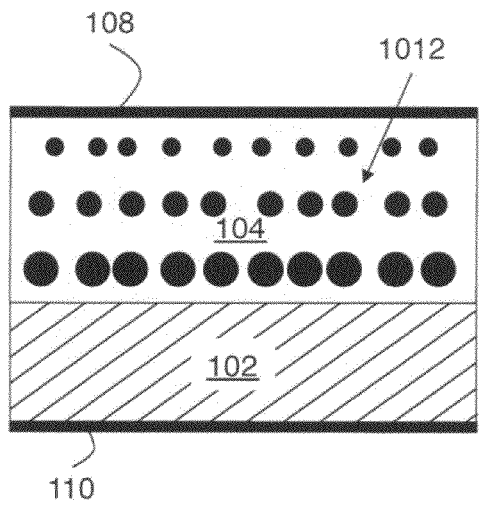
FIGS. 10a-c show some alternative possibilities for inclusion geometry.
Figure 10B:
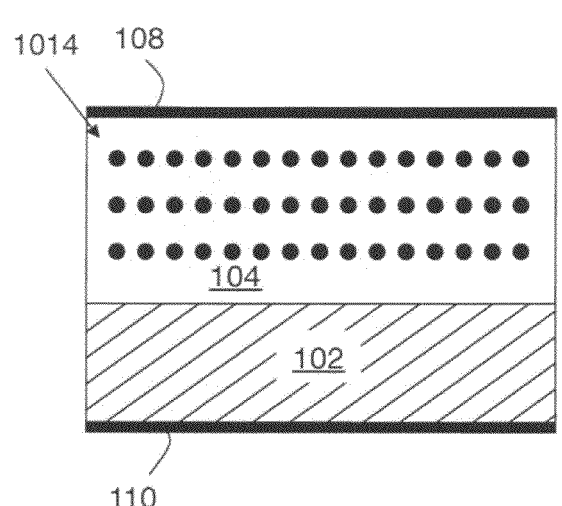
Figure 10C:
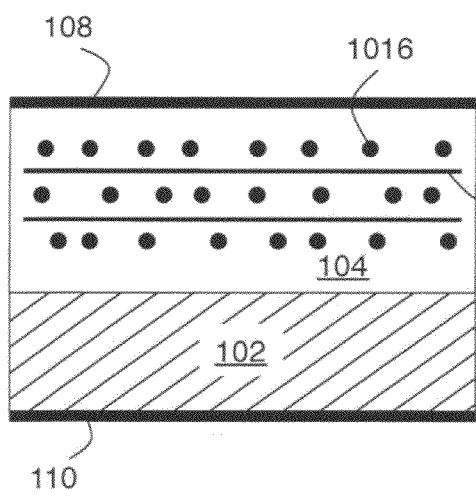

FIGS. 10a-c show some alternative possibilities for inclusion geometry. The example of FIG. 10a shows an active region 104 having inclusions 1012 arranged according to size to provide a work function gradient of the inventions, as described above in connection with FIG. 2b. One feature of significance shown on FIG. 10a is that the inclusions may or may not be laterally aligned with respect to each other.

FIG. 10b shows inclusions 1014 which are laterally aligned with respect to each other. In most cases, it is preferred for an inclusion to be laterally aligned with respect to inclusions on layers above and below the one on which it lies, because that facilitates electron tunneling to/from all of the inclusions in an active region, which is beneficial for energy storage. Conventional inclusion deposition methods, such as quantum dot deposition methods, typically do not provide the degree of lateral control needed to obtain aligned structures as in FIG. 10b. One approach for mitigating the effect of lateral misalignment is shown on FIG. 10c. In this example, active region 104 include alternating quantum-dot and quantum-well layers (one of the dots is referenced as 1016 and one of the quantum wells is referenced as 1018). Since there is no way for a quantum dot to be laterally misaligned with respect to a quantum well, misalignment effects are alleviated.

Figure 10D:
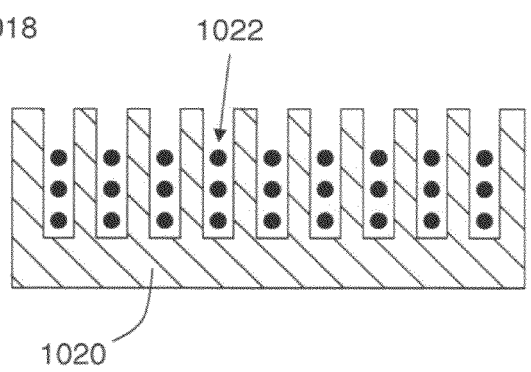
FIG. 10d shows an approach for providing vertically aligned quantum dots.

FIG. 10d shows an approach for providing vertically aligned quantum dots. The basic idea here is to perform ALD in a template 1020 having vertical nano-pores. Quantum dots formed in the same pore (e.g., dots 1022) are laterally aligned with respect to each other. Anodic alumina is a suitable material for template 1020, and it is known that ~3 nm vertical nano-pores can be fabricated in this material. Another possibility for template 1022 is a polycarbonate track-etched membrane. Alternating ALD cycles of metal and dielectric can form aligned quantum dots in the template pores. In this situation, the active region of the AEB would include the template and the contents of the template pores. Thus, the template material is preferably an insulator with high breakdown strength. As deposition cycles of metal and insulator are alternated, the pore will narrow as it is filled. Thus, subsequent depositions of inclusions will be smaller than underlying inclusions due to constriction by the pore walls. This method therefore also provides a mechanism to create a size gradient, and therefore a Fermi level gradient, among the inclusions.

Figure 11:
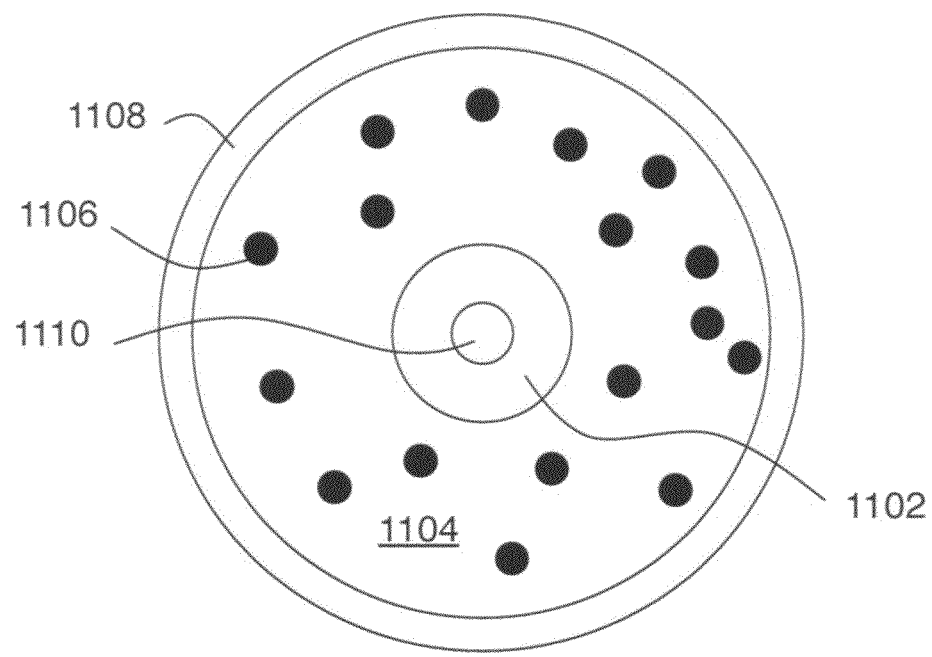
FIG. 11 shows an embodiment of the invention having cylindrical geometry.

FIG. 11 shows an embodiment of the invention having cylindrical geometry. Here active region 1104 and barrier layer 1102 are arranged in a coaxial geometry around central electrode 1110, and are surrounded by outer electrode 1108. One of the inclusions in active region 1104 is referenced as 1106. This geometry has two effects. The first effect is that electric field concentrates and has enhanced field strength near the center of the device. The second effect is that electron concentration also increases as the center of the device is approached, which may lead to the formation of a high-E electron plasma at the inner part of active region 1104. Both of these effects are desirable for energy storage.

Figure 12A:
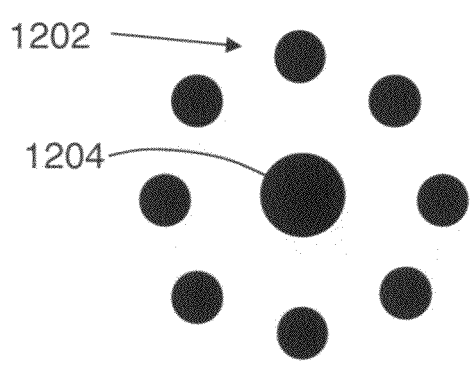
FIGS. 12a-b shows examples of the use of inclusions of different size in connection with embodiments of the invention.
Figure 12B:
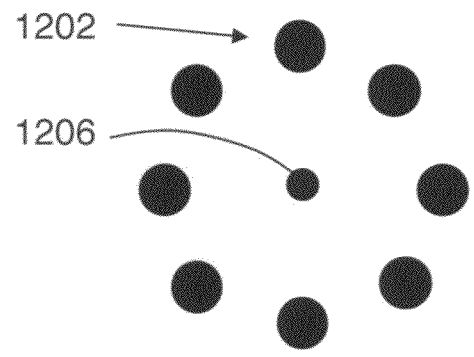

FIGS. 12a-b shows examples of the use of inclusions of different size in connection with embodiments of the invention. In the example of FIG. 12a, a relatively large inclusion 1204 is surrounded by smaller inclusions 1202. In the example of FIG. 12b, a relatively small inclusion 1206 is surrounded by larger inclusions 1202. As indicated above, such size gradients allow for the creation of helpful work function gradients in AEBs.

Figure 13:
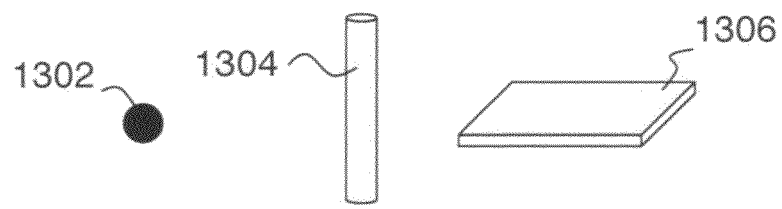
FIG. 13 shows several kinds of inclusion suitable for use in embodiments of the invention.

FIG. 13 shows several kinds of inclusion suitable for use in embodiments of the invention. More specifically, inclusions can be bulk materials, or they can be quantum confined in one dimension (quantum well 1306), two dimensions (quantum wire 1304), and/or three dimensions (quantum dot 1302). The size below which quantum confinement effects become significant depends on the material, but it is typically about 2-10 nm in metals and about 5-40 nm in semiconductors. Thus metallic inclusions having size greater than 10 nm in all three dimensions are likely to effectively have bulk material properties. Similarly, semiconductor inclusions having size greater than 40 nm in all three dimensions are likely to effectively have bulk material properties. The use of quantum dot inclusions (e.g., metal dots having all dimensions 10 nm or less and/or semiconductor dots having all dimensions 40 nm or less), as in the preceding examples, is preferred but not required.

Figures 14A, 14B:
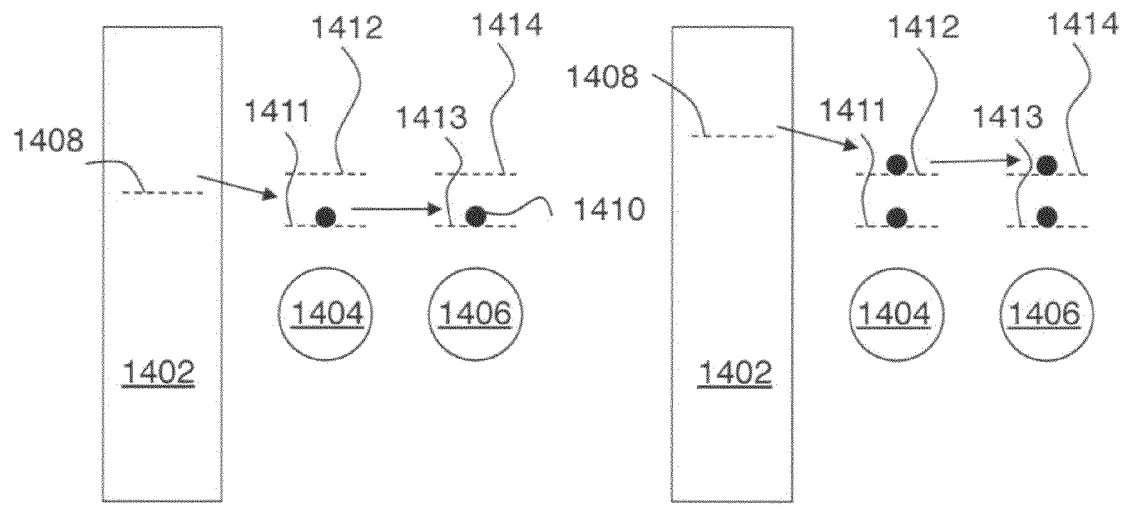
FIGS. 14a-b show charging an embodiment of the invention capable of storing charge in excited states.

Energy storage in the AEB can be further enhanced by making use of excited states of the inclusions. FIGS. 14a-b show charging an embodiment of the invention capable of storing charge in excited states. In this example, an electrode 1402 is in proximity to inclusions 1404 and 1406. Inclusions 1404 and 1406 each have two or more bound electron states. It is convenient to refer to the bound electron states of lowest energy as being ground states, and to refer to all other bound electron states as excited states. In this example, states 1411 and 1413 are the ground states of inclusions 1404 and 1406 respectively. Similarly, states 1412 and 1414 are excited states of inclusions 1404 and 1406 respectively. FIGS. 14a-b (and FIGS. 15a-b) can be regarded as close-up views of an all-electron battery as shown on FIG. 1c at an interface between electrode and active region.

The energy of electrons on electrode 1402 is shown as electrode energy level 1408. This energy level can be altered by varying the electric potential provided to the electrode. In the situation shown on FIG. 14a, energy level 1408 is above energy levels 1411 and 1413, but is below energy levels 1412 and 1414. Thus, electrons (one of which is referenced as 1410) will only occupy the ground states of the inclusions. In the situation shown on FIG. 14b, energy level 1408 is above energy levels 1411 and 1413, and is above energy levels 1412 and 1414. Thus, electrons will occupy the ground states of the inclusions and occupy excited states 1412 and 1414. FIG. 14b may be regarded as showing a charged state of an embodiment of the invention.

Occupation of such excited states provides a quantum energy storage in addition to the energy storage provided by electrostatic charge separation. This filling of high energy levels represents a stored energy that may be released when the capacitor discharges. The electrons in high energy levels may tunnel back into another inclusion or into the electrode and release their energy. This energy, due to high energy-level occupation, is not electrostatic since it is not due to charge displacement. Therefore, this energy may not manifest itself in an increased permittivity of the material, and it will not result in dielectric breakdown. Therefore, additional energy may be stored in a capacitor of the same size and weight, resulting in a higher performing device.

Figures 15A, 15B:
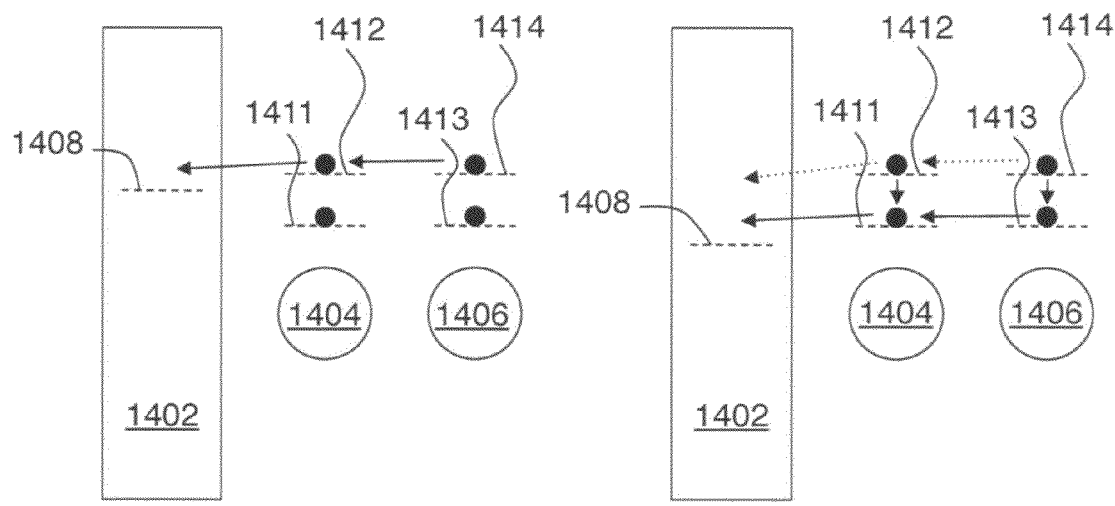
FIGS. 15a-b show discharging an embodiment of the invention capable of storing charge in excited states.

FIGS. 15a-b show discharging an embodiment of the invention capable of storing charge in excited states. More specifically, two different discharging modes are shown. In the mode shown on FIG. 15a, which can be referred to as gradual discharge, the device is biased such that electrode energy level 1408 is between the energy of the highest occupied states and the energy of the next lower states. With this arrangement, electrons arrive at electrode 1402 from excited states (e.g., states 1412 and 1414, as shown). Once all of the excited state electrons leave the AEB, then the device bias can be altered to position electrode energy level 1408 below the ground states of the inclusions, thereby collecting the reminder of the stored charge. In cases where more than 2 energy levels are occupied, gradual discharge entails completely discharging each energy level in order from highest energy to lowest energy. Another way to characterize gradual discharge is that change from excited states is transferred before charge from ground states. Energy selective contacts may also be useful to collect hot carriers, see for example G. J. Conibeer, C.-W. Jiang, D. Konig, S. Shrestha, T. Walsh, M. A. Green, "Selective energy contacts for hot carrier solar cells," Thin Solid Films, Volume 516, Issue 20, Proceedings on Advanced Materials and Concepts for Photovoltaics EMRS 2007 Conference, Strasbourg, France, 30 Aug. 2008, Pages 6968-6973, hereby incorporated by reference in its entirety.

In the mode shown on FIG. 15b, which can be referred to as sudden discharge, the device is biased such that electrode energy level 1408 is below the ground states. With this arrangement, electrons can arrive at electrode 1402 from excited states and from ground states. The most likely electron transfer paths are shown with solid arrows, and the less likely paths are shown with dotted arrows. The reason electrons tend to fall to the inclusion ground states before leaving the inclusions is rapid energy relaxation processes in the inclusions.

Of these two discharge modes, the gradual discharge mode of FIG. 15a is strongly preferred. The reason for this is that energy relaxation as shown on FIG. 15b turns the stored quantum energy of the excited states into heat in the AEB, which totally defeats the purpose of using excited states for energy storage.

Density functional theory (DFT) simulations have been performed on AEB structures to estimate this quantum energy storage effect. Typical simulation results for a single inclusion show that the quantum energy storage effect can be 3-4 orders of magnitude higher than the electrostatic energy storage alone.

The example of FIGS. 14a-15b relates to inclusions in the vicinity of an AEB electrode. This specific configuration for FIGS. 14a-15b is selected for ease of explanation, and is not critical for practicing excited state storage in an AEB. Excited state storage can be practiced in AEBs having any geometrical configuration.

Another way to enhance energy storage in the AEB is to form a Bose-Einstein condensate (BEC) of charge carriers. Electrons and holes in an AEB are fermions, which cannot form a BEC. However, the bound combination of an electron and hole, referred to as an exciton, obeys Bose-Einstein statistics, and can therefore form a BEC. Thus, to form a BEC in an all-electron battery, it is first necessary to form excitons in the AEB, and then the excitons can form a BEC.

Figure 16:
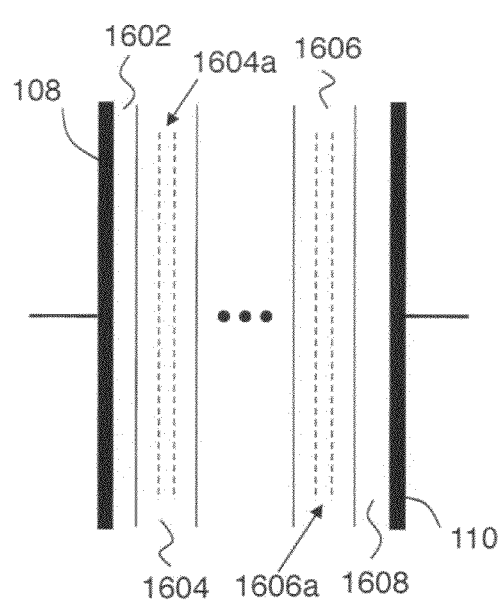
FIG. 16 shows an embodiment of the invention capable of forming excitons in a charged state.

FIG. 16 shows an embodiment of the invention capable of forming excitons in a charged state. In this example, the device includes several active regions, each active region having a first inclusion layer and a second inclusion layer separated by a spacer layer. The active regions are separated by barrier layers. In the example of FIG. 16, active regions 1604 and 1606 are separated from electrodes 108 and 110 by barrier layers 1602 and 1608 respectively. The inclusion-spacer-inclusion sandwiches in active regions 1604 and 1606 are referenced as 1604a and 1606a respectively. Any number of such active regions can be included. As above, inclusion layers have the inclusions, while spacer layers do not. The inclusion layers of each active region are disposed sufficiently close that an electron in one of the inclusion layers and a hole in the other inclusion layer of the same active layer can form an exciton.

Figure 17A:
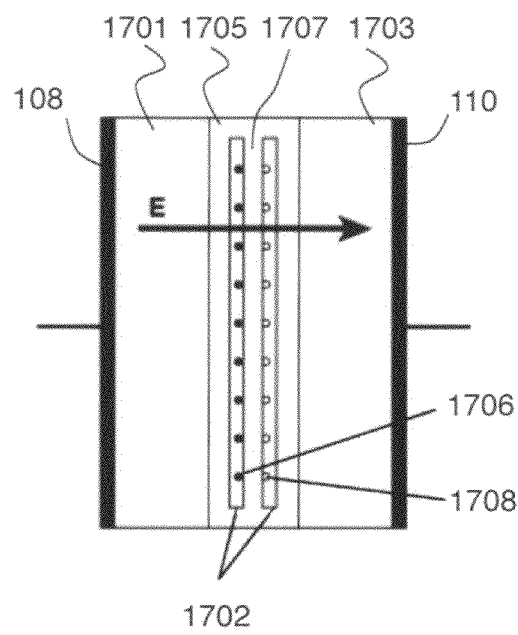
FIGS. 17a-c show several alternative approaches for providing excitons in embodiments of the invention.
Figure 17B:
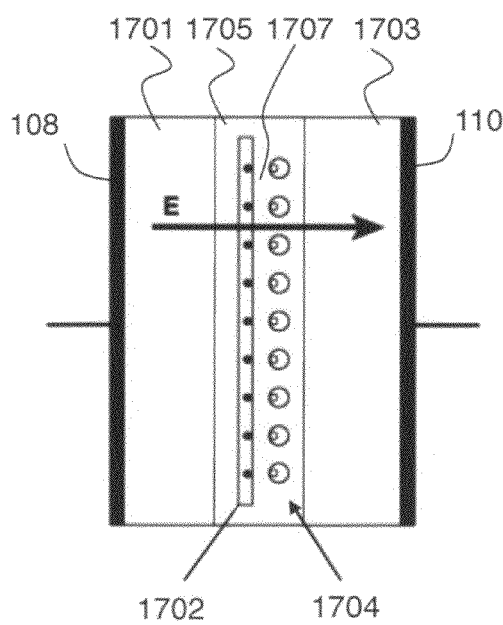
Figure 17C:
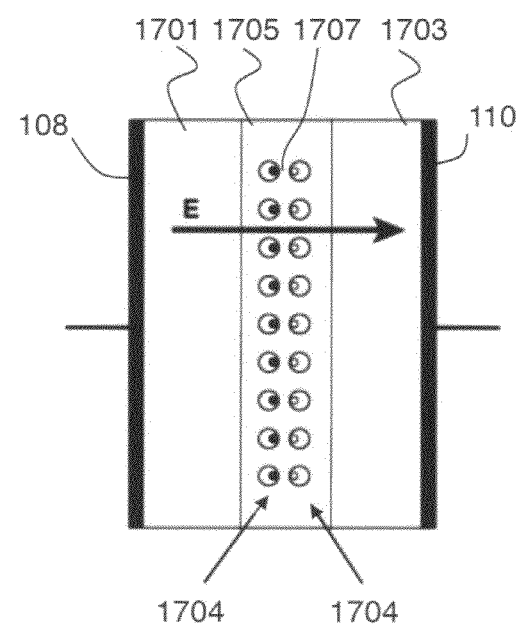

FIGS. 17a-c show several alternative approaches for providing excitons in embodiments of the invention. In the example of FIG. 17a, two quantum wells 1702 separated by spacer layer 1707 are used in active region 1705 to form excitons. Here one of the electrons is referenced as 1706 and one of the holes is referenced as 1708. Active region 1705 is insulated from the electrodes by barrier layers 1701 and 1703. The quantum wells are close enough together for electrons to tunnel from one to the other in the presence of an electric field. The electric field, provided by a voltage on the electrodes, moves electrons from one quantum well to the other quantum well, leaving behind holes which can couple to the electrons to create stable excitons. At sufficient values of the field, the density of excitons is sufficient for Bose-Einstein condensation. This coupled quantum well structure can be repeated an unlimited number of times between the electrodes.

In the example of FIG. 17b, the cell includes a quantum well layer 1702 and a quantum dot layer 1704. The quantum dots localize the charge carriers and aid in coupling them to charge carriers in the well for exciton formation. Again, this structure can be repeated an unlimited number of times between the electrodes. In the example of FIG. 17c, the cell includes two quantum dot layers. Lateral quantum dot alignment is important for the embodiment of FIG. 17c, so if the growth technology employed does not provide laterally aligned quantum dots, then the embodiments of FIGS. 17a-b are preferred to the embodiment of FIG. 17c.

The all electron battery may benefit from formation of a Bose-Einstein condensate (BEC) in the active regions. The boson in this case is an electron-hole pair (i.e., an exciton), which is an aggregate structure that has integer spin, and is therefore a boson. The electron-hole pair exists across a very thin insulating layer which keeps the electron and hole separate, but is thin enough to allow interaction of the electron and hole. The electron-hole pair can be generated by creating an energy difference between two regions, either by virtue of the construction of the materials or by applying an electric field. An electron will then be induced to move from an area of high energy to one of lower energy, leaving a hole behind.

Optionally, a magnetic field can be applied perpendicular to the plane of the active layer to increase the localization of the electrons and holes, increasing their interaction strength and inducing formation of the BEC. At specific magnetic field strengths, where the concentrations of electrons and holes are equal (the Landau levels are half filled), the electron-hole interaction is strongest, and the BEC is most likely to form. In a BEC state, the tunneling probability of electrons and holes between adjacent layers is greatly increased due to the interactions of holes and electrons. Therefore, by "turning on" the BEC (by applying a given magnetic field strength), fast charge/discharge may occur with high efficiency. By "turning off" the BEC (by applying a magnetic field of a different strength), the tunneling probability can be decreased, so that the charges are trapped. In this state, the self-discharge of the battery will be low. As one skilled in the art will appreciate, the magnetic field could be applied by winding coils of a conductive wire into a solenoid around the structure (but not in electrical contact with the structure).

In an embodiment, the AEB includes many layers of quantum confinement (QC) structures separated by insulators. The electron-hole pairs form between two QC layers. In a preferred embodiment, alternating QC layers are made of quantum dots and quantum wells. The electrons (or holes) are localized in the quantum dot and interact with the hole (or electron) in the quantum well. All quantum dots are near a quantum well, allowing a high probability of exciton formation. The QW and QD have a difference in Fermi level due to the different degree of quantum confinement (and they may be made from different materials to tune the Fermi level difference), so the exciton may be formed even in the ground state of the device.

This approach is expected to provide significant advantages. In particular, it is expected that the voltage at which avalanche breakdown occurs can be increased, and that the dielectric constant can also be increased. Both of these effects tend to increase storage capacity, since the stored energy per unit volume in a capacitor with dielectric constant $\in$ and breakdown field strength $E_{bd}$ is $$\frac{1}{2}\varepsilon\varepsilon_0 E_{bd}^2,$$

(where $\in_0$ is the permittivity of free space). Further advantages include high charge/discharge rate, low self discharge rate, high efficiency, and potentially low cost.

Bose-Einstein Condensation is a quantum-mechanical phenomenon in which large numbers of bosons (integer-spin particles) collapse into a single, low-energy quantum state, thus leading to a very low total energy of the entire system of particles. This transition occurs at low temperatures or high particle densities.

The BEC phenomenon does not occur for fermions (half-integer spin particles) such as the electron, which are forbidden by the Pauli Exclusion Principle from occupying the same state as one another. Fermions must stack up in energy, and as a result systems of fermions have much larger total energies than similar systems of bosons which have condensed.

By coupling even numbers of fermions together, as occurs with protons and electrons in the He$^4$ atom, it is possible to form a composite particle that acts like a boson and can undergo BEC. The composite particle made of an electron and a hole in a semiconductor lattice is called an exciton, and it is this particle which can form a BEC in an all-electron battery.

In 3 dimensions, ideal bosonic gases undergo Bose-Einstein condensation at the following temperature/density criterion, when the boson spacing becomes comparable to the particles' thermal wavelength:

$$T_c = \left[\frac{n}{\xi(3/2)}\right]^{2/3} \frac{2\pi\hbar^2}{mk_B}$$

Here n is the boson number density, m is the boson effective mass, and $\zeta$ is the Riemann zeta function.

For semiconductor excitons of typical mass 0.1 $m_e$, this can be achieved at room temperature with a mean exciton spacing of ~10 nm.

For reasons discussed below, BEC in systems of semiconductor excitons in reduced dimensions (<3) is of particular interest. According to the derivation of this formula, BEC cannot occur for an ideal gas of bosons in fewer than 3 dimensions. This is due to the non-vanishing density of particle states at low energies in reduced dimensions, preventing complete filling of excited states according to the Bose-Einstein distribution.

The above derivation, however, uses the thermodynamic limit of infinite particles and infinite sample size. It has been predicted that in 2 dimensions, BEC is in fact possible at finite particle density if the bosons are confined to a box-like potential:

$$n = 2(L/\lambda)^2 \ln(L/\lambda) \text{ where } \lambda = \sqrt{\frac{2\pi\hbar^2}{mk_B T}}$$

is the thermal deBroglie wavelength, n is the 2D number density of bosons, and L is the linear size of the sample.

For sample sizes of 1 mm and smaller, this formula predicts BEC at room temperature for particle densities under $1\times10^{16}$ per square meter, at which point the average exciton separation would be similar to the exciton Bohr radius (typically ~10 nm in semiconductors), destroying the bosonic nature of the particles. It is thus reasonable to expect that excitonic BEC may be observed at room temperature in macroscopic 2D quantum wells using appropriate materials to set the exciton effective mass and Bohr radius.

A major impediment to excitonic BEC studies to date has been the short lifetime (<1 ns) of semiconductor excitons, shorter than the typical excitonic thermalization time (>1 ns). As a result of this, excitons tend to recombine and disappear before they can cool down to the temperature of the lattice, so that the average exciton temperature never actually reaches the intended BEC temperature, and no BEC is formed.

Bi-excitons formed in coupled quantum wells (electron in one well, hole in a parallel well a few nm away) avoid this problem by spatially separating the exciton constituent particles, increasing the lifetime by orders of magnitude to levels much larger than thermalization times.

In order to create a 2D system of bi-excitons, one should be able to grow extremely thin films over macroscopic areas using alternating semiconductor/dielectric materials. Quantum wells should be significantly thinner than the exciton Bohr radius for the given material (typically ~10 nm) in order to suppress the $3^{rd}$ dimension, and their separation should be of the same order so that holes and electrons in their respective wells are coupled by the electrostatic force.

The use of a BEC in an all-electron battery is expected to provide the advantages of increased breakdown voltage and increased dielectric constant.

Figure 18A:
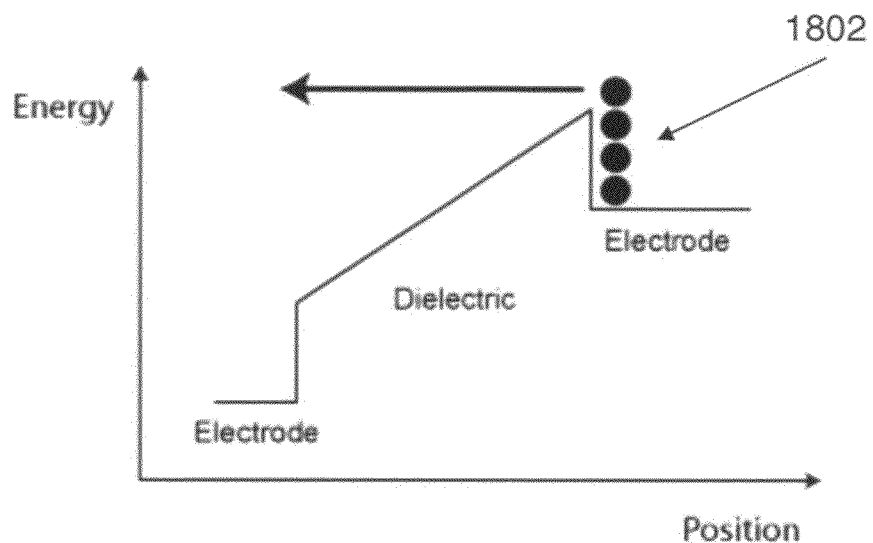
FIGS. 18a-b show how charge storage can be affected by formation of a Bose-Einstein condensate of excitons.
Figure 18B:
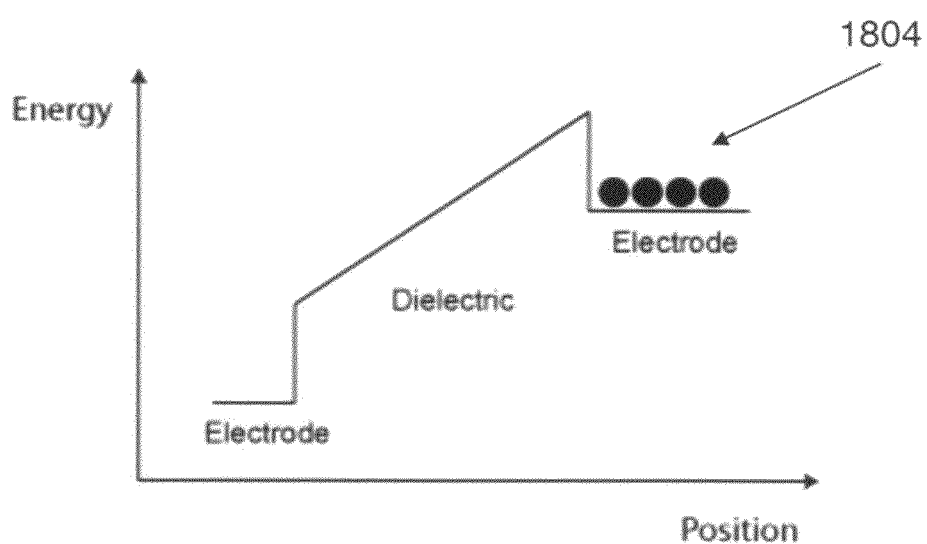

Breakdown voltage is a major limitation in capacitors. One mechanism by which dielectric insulators allow a current, draining the energy stored in a device, is the field emission and subsequent avalanche breakdown associated with stored electrons gaining enough energy to overcome the potential barrier of the dielectric. As illustrated in FIG. 18a, because of the fermionic nature of electrons and holes, these particles must stack in energy (as shown by 1802) as they accumulate in an electrode or active layer of a storage device. Once the energy of the highest electrons is large enough, thermal fluctuations are likely to send them over the dielectric barrier and cause breakdown. In contrast, bosonic particles such as excitons need not stack in energy, and in the BEC phase, most share the lowest allowable state, as shown by 1804 on FIG. 18b. In this case, adding more charge does not increase the likelihood of avalanche breakdown, and as a result, the breakdown voltage limit on a device can be much larger than in the standard fermionic case.

The bound state of an exciton has a lower total energy than the combined energy of a free electron in a conduction band and its corresponding free hole in the valence band. The difference in energy between these two cases is referred to as the binding energy of the exciton and can reach several tenths of an electron volt in nanostructures. If a collection of excitons forms a BEC, then each exciton is allowed the maximum possible binding energy, as opposed to the non-condensed state in which the constituent particles stack in energy toward the free case, lowering the average binding energy of the excitons. Because BEC can allow a significantly lower total energy for a system of excitons than a non-condensed or free carrier system, the formation of such excitons through the separation of charges over a small barrier is thermodynamically more favorable in the BEC case. As a result, we expect to see an increase in the number of excitons formed at a given device voltage in the BEC case, leading to a larger effective dielectric constant and hence a larger storage capacity.

The preceding description has been by way of example as opposed to limitation, and many variations of the given examples can be employed to practice the invention. For example, practice of the invention does not depend critically on the fabrication sequences and/or methods employed. As another example, the size gradient of inclusions may be combined with a material gradient of inclusions, and they may be arranged in any fashion. As a further example, the inclusions may have any shape such as a sphere, cone, pyramid, or approximately two-dimensional shape such as a triangle or circle. In general, practice of the invention does not depend critically on the materials selected for electrodes, active regions, barrier layers, or inclusions.

In cases where several active regions are present in a single AEB, the active regions may or may not have the same design and may or may not be based on the same principles. For example, an AEB with four active regions could have a first active region that is a single active layer, a second active region that includes multiple inclusion and spacer layers, a third active region that uses excited state energy storage, and a fourth active region that forms a BEC in its charged state.

The physical AEB mechanisms considered herein (individually or in any combination) can also be practiced in combination with area-enhanced electrodes as described in the above cited U.S. application Ser. No. 12/798,102, filed on Mar. 29, 2010, and entitled "All-electron battery having area-enhanced electrodes".

The preceding description has been in terms of electron tunneling. In some materials, quasi-particles known as holes may exist, and in such materials an equivalent description in terms of hole tunneling is possible. However, it is inherent in the relevant physical laws that if a hole tunnels from A to B, then necessarily an electron has tunneled from B to A.

The invention claimed is:

1. A solid-state energy storage device comprising:
   a first electrode;
   a second electrode;
   one or more active layers and one or more tunneling barrier layers sandwiched between the first electrode and the second electrode;
   wherein the active layers comprise inclusions embedded within a solid active layer matrix, and wherein electrons can flow to or from the inclusions by tunneling through the active layer matrix;
   wherein the tunneling barrier layers substantially prevent electron tunneling across the tunneling barrier layers and also substantially block all other direct current flow;
   wherein the device is capable of storing energy by establishing a charge separation with the inclusions, and wherein the device is capable of providing energy by using the charge separation as an energy source; and
   wherein the energy storage device is configured to provide electrostatic energy storage.

2. The device of claim 1, wherein the device is a two-terminal device having only the first and second electrodes as external terminals.

3. The device of claim 1, wherein the first and second electrodes each have a geometrical area of 1 $\mu m^2$ or greater.

4. The device of claim 1, wherein the charge separation between the inclusions is established by application of a voltage of 5V or more between the first and second electrodes.

5. The device of claim 1, wherein a volume averaged charge separation density of the device when the charge separation is present is $10^{-4}$ $e^-/nm^3$ or greater.

6. The device of claim 1, wherein the inclusions are selected from the group consisting of: quantum well, quantum wire, quantum dot, and bulk material.

7. The device of claim 1, wherein the inclusions are arranged according to size to provide a smooth work function gradient of the inclusions.

8. The device of claim 1, wherein a first of the inclusions is surrounded by several others of the inclusions each having a smaller size than the first inclusion.

9. The device of claim 1, wherein a first of the inclusions is surrounded by several others of the inclusions each having a larger size than the first inclusion.

10. The device of claim 1, wherein a selected one of the active layers is adjacent to the first electrode or to the second electrode, and wherein electrons can tunnel from inclusions in the selected active layer to the adjacent electrode.

11. The device of claim 1, wherein at least one of the active layers has inclusions which are spaced apart such that electrons can tunnel between inclusions.

12. The device of claim 1, wherein at least one of the active layers comprises a multilayer structure having alternating spacer and inclusion layers, wherein the inclusion layers include the inclusions, wherein the spacer layers substantially do not include the inclusions, and wherein electrons can flow between the inclusion layers by tunneling through the spacer layers.

13. The device of claim 12, wherein the inclusion layers comprise different materials having different work functions, and wherein the inclusion layers are disposed to form a Fermi level gradient.

14. The device of claim 12, wherein the inclusion layers comprise a material having an electron affinity that is lower than an electron affinity of the spacer layers.

15. The device of claim 1, wherein at least one of the active layers comprises a first inclusion layer and a second inclusion layer separated by a spacer layer, wherein the inclusion layers include the inclusions, wherein the spacer layers substantially do not include the inclusions, and wherein the inclusion layers are disposed sufficiently close to each other that electrons in the first inclusion layer of a selected active layer and holes in the second inclusion layer of the selected active layer can form excitons.

16. The device of claim 15, wherein the inclusions in the first inclusion layer are selected from the group consisting of quantum wells, quantum wires, and quantum dots, and wherein the inclusions in the second inclusion layer are selected from the group consisting of quantum wells, quantum wires, and quantum dots.

17. The device of claim 15, wherein the device is capable of forming a Bose-Einstein condensate of the excitons.

18. The device of claim 1, wherein at least one of the inclusions has two or more bound electron states having different binding energy, wherein a ground state is the bound electron state having the least energy, and wherein bound electron states other than the ground state are referred to as excited states.

19. The device of claim 18, wherein the device is capable of storing energy by charge transfer to at least one of the excited states.

20. The device of claim 19, wherein energy can be provided by the device by transferring charge from excited states before transferring charge from corresponding ground states.

* * * * *